United States Patent
Kikuchi

(10) Patent No.: US 9,768,215 B2
(45) Date of Patent: Sep. 19, 2017

(54) SOLID-STATE IMAGING APPARATUS, METHOD OF MANUFACTURING THE SAME, AND ELECTRONIC APPARATUS

(71) Applicant: Sony Corporation, Tokyo (JP)

(72) Inventor: Koji Kikuchi, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 15/239,430

(22) Filed: Aug. 17, 2016

(65) Prior Publication Data

US 2016/0358963 A1 Dec. 8, 2016

Related U.S. Application Data

(63) Continuation of application No. 14/475,690, filed on Sep. 3, 2014, now Pat. No. 9,450,008.

(30) Foreign Application Priority Data

Sep. 17, 2013 (JP) ................. 2013-191713

(51) Int. Cl.
  H01L 31/0232 (2014.01)
  H01L 27/146 (2006.01)

(52) U.S. Cl.
  CPC .... *H01L 27/14623* (2013.01); *H01L 27/1462* (2013.01); *H01L 27/1463* (2013.01); *H01L 27/1464* (2013.01); *H01L 27/14621* (2013.01); *H01L 27/14627* (2013.01); *H01L 27/14643* (2013.01); *H01L 27/14683* (2013.01); *H01L 27/14685* (2013.01)

(58) Field of Classification Search
  CPC .......... H01L 27/1463; H01L 27/14621; H01L 27/1462; H01L 27/14683; H01L 27/14627; H01L 27/14623; H01L 27/14685; H01L 27/1464; H01L 27/14643
  See application file for complete search history.

(56) References Cited

U.S. PATENT DOCUMENTS

| 9,263,487 | B2 | 2/2016 | Kato et al. | |
|---|---|---|---|---|
| 9,293,493 | B2* | 3/2016 | Kobayashi | H01L 27/14623 |
| 9,502,453 | B2* | 11/2016 | Tu | H01L 27/14627 |
| 2007/0103572 | A1* | 5/2007 | Yokozawa | H01L 27/14621 348/272 |
| 2009/0189055 | A1* | 7/2009 | Lin | H01L 27/14621 250/208.1 |
| 2010/0265384 | A1* | 10/2010 | Tay | H01L 27/14621 348/336 |
| 2010/0308427 | A1* | 12/2010 | Lenchenkov | H01L 27/14625 257/432 |
| 2011/0204463 | A1* | 8/2011 | Grand | G02B 5/201 257/432 |

(Continued)

FOREIGN PATENT DOCUMENTS

JP 2010-160313 7/2010

*Primary Examiner* — Victor A Mandala
(74) *Attorney, Agent, or Firm* — Dentons US LLP

(57) ABSTRACT

A solid-state imaging apparatus including a plurality of phase difference detection pixels configured adjacent to one another; and an isolation structure arranged so as to isolate light entering each of light-receiving units of the plurality of phase difference detection pixels, in which the isolation structure is formed so as to have a inclined side wall surface whose cross section is tapered.

9 Claims, 25 Drawing Sheets

(56) References Cited

U.S. PATENT DOCUMENTS

| | | | |
|---|---|---|---|
| 2012/0200727 A1* | 8/2012 | Kato | H01L 27/14627 |
| | | | 348/222.1 |
| 2012/0300102 A1* | 11/2012 | Tamura | H01L 27/14607 |
| | | | 348/294 |
| 2013/0207212 A1 | 8/2013 | Mao et al. | |
| 2014/0085517 A1* | 3/2014 | Lenchenkov | H01L 27/14629 |
| | | | 348/294 |
| 2014/0225215 A1* | 8/2014 | Chien | H01L 24/05 |
| | | | 257/447 |
| 2014/0264719 A1* | 9/2014 | Chou | H01L 21/76229 |
| | | | 257/506 |

* cited by examiner

SOLID-STATE IMAGING APPARATUS, METHOD OF MANUFACTURING THE SAME, AND ELECTRONIC APPARATUS

CROSS REFERENCE TO RELATED APPLICATIONS

This application is a continuation of U.S. patent application Ser. No. 14/475,690 filed Sep. 3, 2014, the entirety of which is incorporated herein by reference to the extent permitted by law. This application claims the benefit of priority under 35 U.S.C. §119 to Japanese Priority Patent Application JP 2013-191713 filed Sep. 17, 2013, the entire contents of each which is incorporated herein by reference.

BACKGROUND

The present technology relates to a solid-state imaging apparatus, a method of manufacturing the solid-state imaging apparatus, and an electronic apparatus, and more particularly to a solid-state imaging apparatus, a method of manufacturing the solid-state imaging apparatus, and an electronic apparatus that can prevent the accuracy of auto-focus (AF) from decreasing.

In recent years, there has been known a solid-state imaging apparatus which performs a phase difference detection and AF by providing a phase difference detection pixel in which a part of a photoelectric conversion unit is light-shielded in an imaging element (for example, see Japanese Patent Application Laid-Open No. 2010-160313). The AF by means of such a phase difference detection method is superior to AF by means of a contrast detection method in the past in that a high-speed AF operation is possible.

The phase difference detection pixel for realizing this high-speed AF operation includes a function of selecting an incidence angle of light entering an image surface and receiving the light (hereinafter referred to as an isolation capability), and generally isolates and receives light entering from a left side of a pupil surface and light entering from a right side of a pupil surface by a light-shielding film provided on an upper layer of the photoelectric conversion unit, so that a focus position is detected.

SUMMARY

Meanwhile, in recent years, a tendency has been observed that pixel sizes reduce as the number of pixels increases. However, this may cause a decrease in sensitivity of the pixels. In particular, the phase difference detection pixel is decreased in sensitivity by a light-shielding of a light-shielding film in comparison with ordinary pixels for imaging (imaging pixels), so that the phase difference detection pixel strongly undergoes influences of the decrease in sensitivity by reducing pixel sizes. As a result, the reduction in pixel sizes may decrease the accuracy of the AF by means of the phase difference detection method.

The present technology has been conceived in view of the above described circumstances so that the accuracy of the AF can be prevented from being decreased.

According to an embodiment of the present technology, there is provided a solid-state imaging apparatus including a plurality of phase difference detection pixels configured adjacent to one another, and an isolation structure arranged so as to isolate light entering each of light-receiving units of the plurality of phase difference detection pixels, in which the isolation structure is formed so as to have a inclined side wall surface whose cross section is tapered.

The solid-state imaging apparatus may further includes a microlens formed corresponding to the plurality of phase difference detection pixels.

A difference between a refractive index of the isolation structure and a refractive index of a surrounding material of the isolation structure may be at least 0.2.

The refractive index of the isolation structure may be about one.

The microlens may be formed so as to have a lens power higher than other microlens formed corresponding to imaging pixels arranged in a pixel region, together with the plurality of phase difference detection pixels.

The isolation structure may be formed so that the inclination of the side wall surface is adjusted in accordance with an isolation property of the plurality of phase difference detection pixels.

The isolation structure may be formed so that a width of an upper surface is adjusted in accordance with an isolation property of the plurality of phase difference detection pixels.

A trench may be formed between each of the light-receiving units of the plurality of phase difference detection pixels.

The isolation structure may have an antireflection film formed on an upper surface thereof.

The plurality of phase difference detection pixels may have an optical filter formed in a lower layer of the microlens.

The microlens may be formed corresponding to two adjacent phase difference detection pixels.

The microlens may be formed corresponding to four phase difference detection pixels arranged in a matrix form.

According to an embodiment of the present technology, there is provided a method of manufacturing a solid-state imaging apparatus including a plurality of phase difference detection pixels configured adjacent to one another, and an isolation structure arranged so as to isolate light entering each of light-receiving units of the plurality of phase difference detection pixels, the method including forming the isolation structure so as to have an inclined side wall surface whose cross section is tapered.

According to an embodiment of the present technology, there is provided an electronic apparatus including a solid-state imaging apparatus having a plurality of phase difference detection pixels configured adjacent to one another, and an isolation structure arranged so as to isolate light entering each of light-receiving units of the plurality of phase difference detection pixels, in which the isolation structure has a solid-state imaging apparatus formed so as to have a inclined side wall surface whose cross section is tapered.

According to an embodiment of the present technology, the isolation structure is arranged so as to isolate light entering each of light-receiving unit of a plurality of phase difference detection pixels and is formed so as to have an inclined side wall surface whose cross section is tapered.

According to an embodiment of the present technology, the accuracy of the AF can be prevented from being decreased.

These and other objects, features and advantages of the present disclosure will become more apparent in light of the following detailed description of best mode embodiments thereof, as illustrated in the accompanying drawings.

DETAILED DESCRIPTION OF EMBODIMENTS

Hereinafter, embodiments of the present technology will be described with reference to the drawings <Configuration Example of Solid-State Imaging Apparatus>

Figure 1:
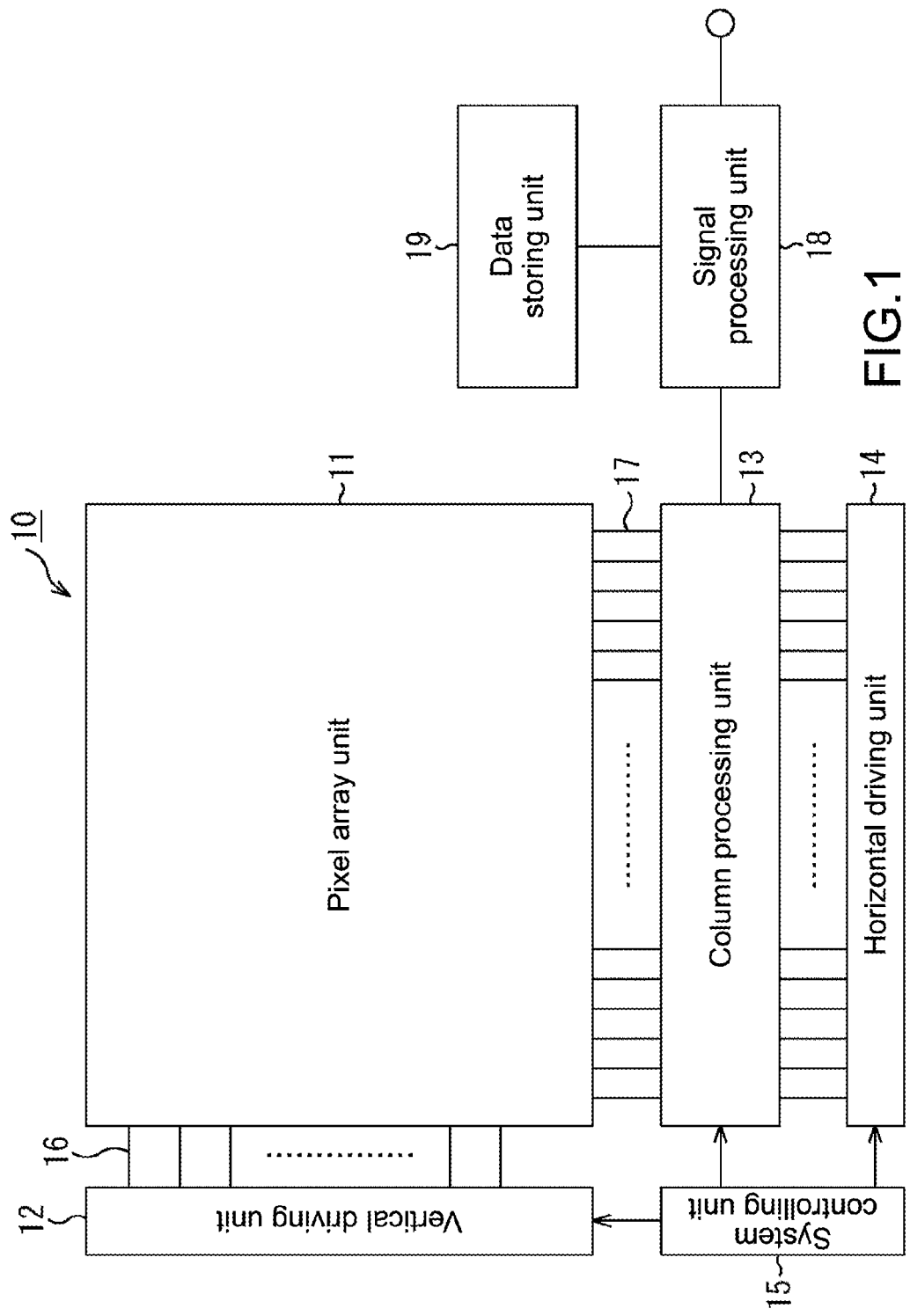
FIG. 1 is a block diagram showing a configuration example of a solid-state imaging apparatus to which an embodiment of the present technology is applied.

FIG. 1 is a block diagram showing an embodiment of a solid-state imaging apparatus to which the present technology is applied. The following description explains a configuration of a rear-surface illumination type Complementary Metal Oxide Semiconductor (CMOS) image sensor which is one of amplification type solid-state imaging apparatuses. It should be noted that the present technology is not limited to the application to the rear-surface illumination type CMOS image sensor and is applicable to charge transfer type solid-state imaging apparatuses such as a front-surface illumination type CMOS image sensor, other amplification type solid-state imaging apparatus, a Charge Coupled Device (CCD) image sensor.

A CMOS image sensor 10 shown in FIG. 1 includes a pixel array unit 11 formed on a semiconductor substrate (not shown) and a peripheral circuit unit integrated on the same semiconductor substrate as the pixel array unit 11. The peripheral circuit is constituted of a vertical driving unit 12, a column processing unit 13, a horizontal driving unit 14 and a system controlling unit 15, for example.

Further, the CMOS image sensor 10 includes a signal processing unit 18 and a data storing unit 19.

In the pixel array unit 11, unit pixels (hereinafter, also simply referred to as "pixels") having a photoelectric conversion unit that generates and accumulates photocharges in accordance with the amount of received light are two-dimensionally arranged in a row direction and a column direction, in other words, as a matrix form. Here, the row direction refers to a direction in which pixels in a pixel row are arranged (i.e., the horizontal direction), and the column direction refers to a direction in which pixels in a pixel column are arranged (i.e., the vertical direction).

In the pixel array unit 11, with respect to the pixel arrangement as the matrix form, pixel driving lines 16 are wired along the row direction for each pixel row, and vertical signal lines 17 are wired along the column direction for each pixel column. Each of the pixel driving lines 16 transmits a driving signal for driving when a signal is read out from a pixel. Although FIG. 1 shows one wiring as the pixel driving line 16, the number of the lines is not limited to one. One terminal of the pixel driving line 16 is connected to an output terminal corresponding to each row of the vertical driving unit 12.

The vertical driving unit 12 includes a shift register, an address decoder, and the like, and drives all the pixels in the pixel array unit 11 at the same time or by row unit or the like. That is, the vertical driving unit 12 configures a driving unit that drives each pixel in the pixel array unit 11, together with the system controlling unit 15 that controls the vertical driving unit 12. Although an illustration of a specific configuration of the vertical driving unit 12 is omitted here, in general, the vertical driving unit 12 includes two scanning systems: a read scanning system and a sweep scanning system.

The read scanning system sequentially and selectively scans unit pixels in the pixel array unit 11 by row unit to read out signals from the unit pixels. The signals read out from the unit pixels are analog signals. The sweep scanning system sweep-scans a row-to-be-read that is to be subjected to read scanning by the read scanning system to precede the read-scanning by a time for shutter speed.

The sweep scanning by the sweep scanning system sweeps unnecessary charges from photoelectric conversion units in the unit pixels in the row-to-be-read, so that the photoelectric conversion units are reset. Further, by sweeping the unnecessary charges (by resetting) by the sweep scanning system, an electronic shuttering operation is performed. Here, the electronic shuttering operation refers to an operation to abandon photocharges of the photoelectric conversion units to start new light exposure (to start accumulating photocharges).

Signals read out by the reading operation by the read scanning system correspond to the amount of light received after the preceding reading operation or the electronic shuttering operation. Further, a period from the reading timing by the preceding reading operation or the sweeping timing by the electronic shuttering operation to the reading timing by the reading operation this time is a light exposure period of photocharges in a unit pixel.

A signal output from each unit pixel in a pixel row that is selectively scanned by the vertical driving unit 12 is input to the column processing unit 13 through each of the vertical signal lines 17 for each pixel column. The column processing unit 13 performs a predetermined signal processing on the signal output from each pixel in a selected row through each of the vertical signal lines 17 for each pixel column in the pixel array unit 11, and temporally holds a pixel signal after the signal processing.

Specifically, the column processing unit 13 performs at least a noise removing processing, such as a correlated double sampling (CDS) processing, as the signal processing. The CDS processing by the column processing unit 13 removes a reset noise or a fixed pattern noise that is unique to a pixel, such as a variation in the threshold value of an amplifying transistor in a pixel. Instead of the noise removing processing, for example, the column processing unit 13 can have an analog-to-digital (AD) conversion function to convert an analog pixel signal to a digital signal and output the digital signal.

The horizontal driving unit 14 includes a shift register, an address decoder, and the like, and sequentially selects a unit circuit corresponding to a pixel column in the column processing unit 13. By the selective scanning by the horizontal driving unit 14, pixel signals that are subjected to the signal processing for each unit circuit in the column processing unit 13 are sequentially output.

The system controlling unit 15 includes a timing generator that generates a variety of timing signals and the like, and controls driving of the vertical driving unit 12, the column processing unit 13, the horizontal driving unit 14, and the like, based on a variety of timing signals generated by the timing generator.

The signal processing unit 18 has at least an arithmetic processing function, and performs a variety of signal processing, such as an arithmetic processing on the pixel signal output from the column processing unit 13. The data storing unit 19 temporally stores data necessary for the signal processing by the signal processing unit 18.

It should be noted that the signal processing unit 18 and the data storing unit 19 may be integrated on the same substrate (semiconductor substrate) as the CMOS image sensor 10 or may be arranged over another substrate that is different from the substrate over which the CMOS image sensor 10 is formed. Moreover, each processing of the signal processing unit 18 and the data storing unit 19 may be a processing by software or an external signal processing unit such as a digital signal processor (DSP) circuit provided over another substrate that is different from the substrate over which the CMOS image sensor 10 is formed.

<Structure Example of Solid-State Imaging Apparatus>

Figure 2:
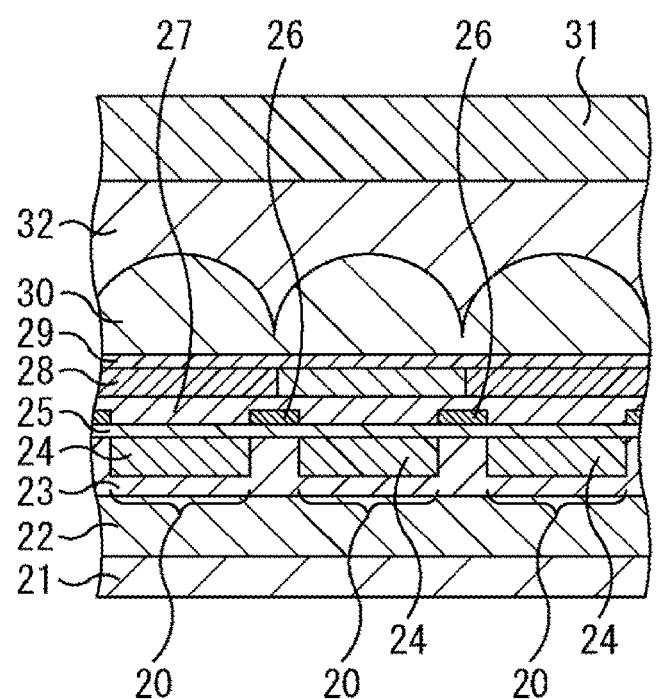
FIG. 2 is a cross-sectional view showing a structure example of the solid-state imaging apparatus.

Next, referring to FIG. 2, a description will be given on a structure example of the CMOS image sensor 10. FIG. 2 shows a cross-sectional configuration of pixels for imaging (imaging pixels) 20 in the rear-surface illumination type CMOS image sensor 10.

In the CMOS image sensor 10 shown in FIG. 2, over a supporting substrate 21, a wiring layer 22 is formed using SiO$_2$, and a silicon substrate 23 is formed over the wiring layer 22. The supporting substrate 21 is formed of silicon, glass epoxy, glass, plastic, and the like, for example. Over the surface of the silicon substrate 23, a plurality of photodiodes 24 are formed at a predetermined interval, each as a photoelectric conversion unit (light-receiving unit) of each of the imaging pixels 20.

Over the silicon substrate 23 and the photodiodes 24, a protection film 25 is formed using SiO$_2$. Over the protection film 25, light-shielding films 26 for preventing light leakage to adjacent pixels 20 are each formed between the adjacent photodiodes 24. The light-shielding films 26 are formed of a metal such as tungsten (W).

Over the protection film 25 and the light-shielding films 26, a planarization film 27 for planarizing a region where color filters are to be formed is formed. Over the planarization film 27, a color filter layer 218 is formed. In the color filter layer 28, a plurality of color filters are provided for each imaging pixels 20, and colors of the respective color filters are arranged in accordance with a Bayer arrangement, for example.

Over the color filter layer 28, a first organic material layer 29 is formed. The first organic material layer 29 is formed of an acrylic resin material, a styrene resin material, an epoxy resin material, and the like, for example. Over the first organic material layer 29, a microlens 30 is formed. The microlens 30 is formed of a transparent material having a refractive index 1.45, for example.

Over the microlens 30, a cover glass 31 is adhered via a second organic material layer 32. The cover glass 31 is not limited to glass and may be formed of a transparent plate using a resin and the like. Moreover, between the microlens 30 and the cover glass 31, a protection film may be formed for preventing the entrance of moisture and an impurity. The second organic material layer 32 is formed of an acrylic resin material, a styrene resin material, an epoxy resin material, and the like as with the first organic material layer 29.

It should be noted that the configuration shown in FIG. 2 is merely example. The present technology described below may be applied to other configuration, such as not only a configuration having the above described layers each, but also a configuration that other layers are added or any of the layers described above are removed.

<Structure Example of Phase Difference Detection Pixel>

The above described CMOS image sensor 10 includes phase difference detection pixels for receiving a phase difference detection signal to realize a phase difference detection. The phase difference detection signal is a signal indicating a shift direction (defocus direction) and a shift amount (defocus amount) of a focus.

The phase difference detection pixels are arranged in the form of being mixed in the pixel array unit 11 (pixel region) shown in FIG. 1, in which the imaging pixels are two-dimensionally arranged in a matrix form. For example, the phase difference detection pixels are disposed to intersect with each other in the vertical and horizontal directions in the pixel region.

Figure 3:
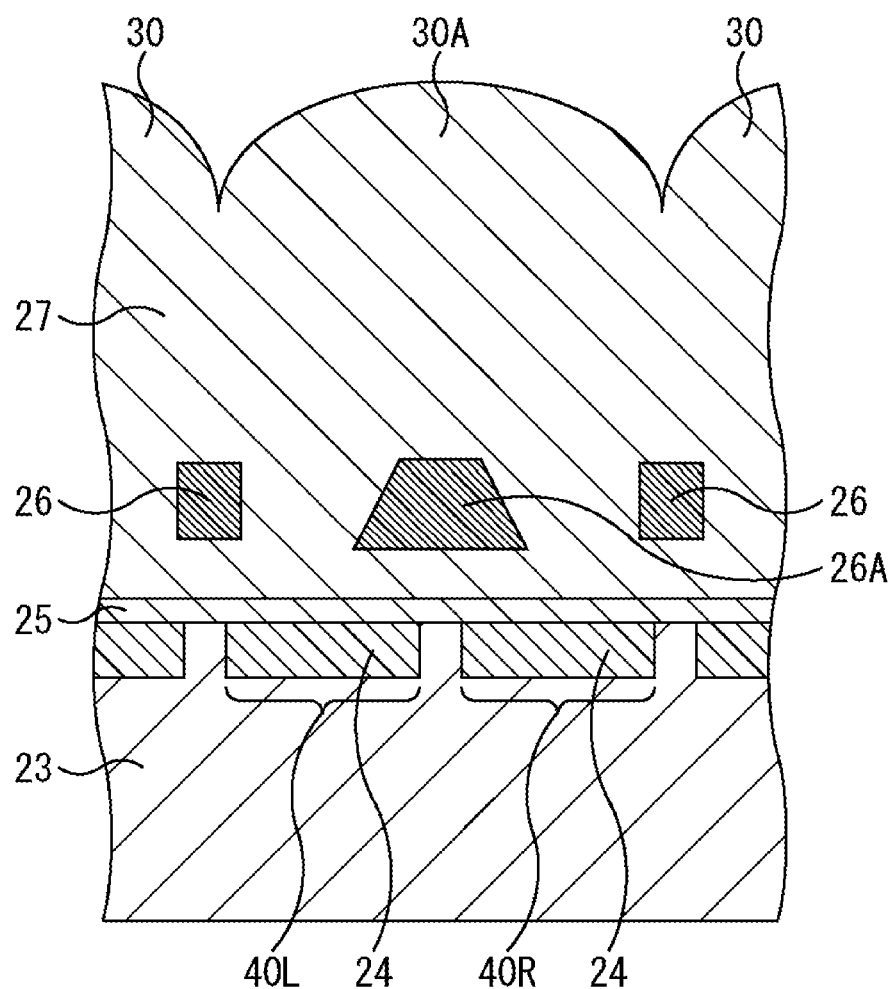
FIG. 3 is a cross-sectional view showing a structure example of phase difference detection pixels.
Figure 4:
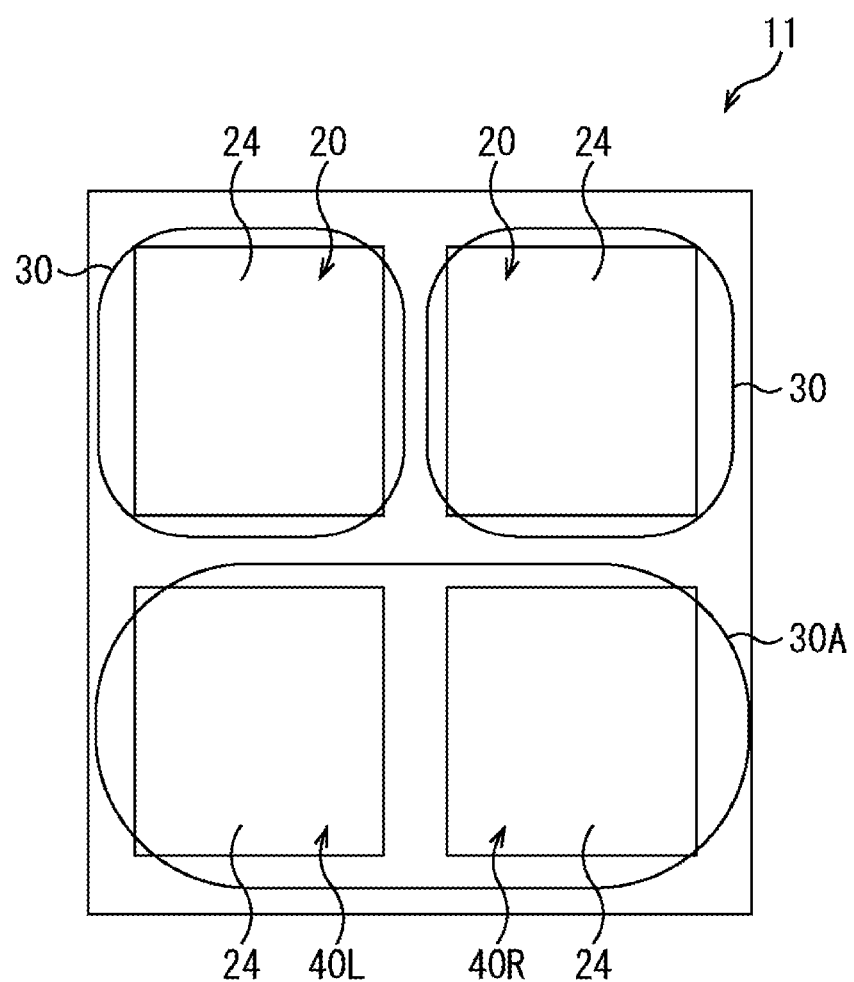
FIG. 4 is a plan view showing the structure example of the phase difference detection pixels.

The imaging pixels are slightly different from the phase difference detection pixels in the structure. Here, an example of the structure of the phase difference detection pixels will be described with reference to FIG. 3 and FIG. 4. FIG. 3 is a cross-sectional view showing phase difference detection pixels, and FIG. 4 is a plan view showing the phase difference detection pixels.

It should be noted that in the cross-sectional view shown in FIG. 3, portions similar to those of the cross-sectional view shown in FIG. 2 are denoted by the same reference symbols and their descriptions will be omitted as appropriate.

In FIG. 3, two phase difference detection pixels 40L and 40R are adjacently arranged in the horizontal direction. The phase difference detection pixel 40L receives light entering from a left side of a pupil surface, and the phase difference detection pixel 40R receives light entering from a right side of a pupil surface.

Over the phase difference detection pixels 40L and 40R, an isolation structure 26A is arranged so as to isolate light entering the photodiodes 24 of the phase difference detection pixels 40L and 40R.

The isolation structure 26A is formed between the photodiodes 24 of the adjacent phase difference detection pixels 40L and 40R so as to light-shield a part of each of the photodiodes 24. Specifically, the isolation structure 26A is arranged so as to extend over a boundary (element isolation region) between the photodiodes 24 of the phase difference detection pixels 40L and 40R adjacently arranged in the horizontal direction. The photodiode 24 of the phase difference detection pixel 40L is light-shielded on the right side by the isolation structure 26A. The photodiode 24 of the phase difference detection pixel 40R is light-shielded on the left side by the isolation structure 26A.

Further, the isolation structure 26A includes inclined side wall surfaces facing the phase difference detection pixels 40L and 40R and is formed so as to have a tapered cross section toward the direction where light enters (upward direction in FIG. 3). The isolation structure 26A is formed over the same layer as the light-shielding film 26 and is formed of a metal such as W, as with the light-shielding film 26.

Moreover, as shown in FIG. 4, with respect to the imaging pixels 20, one microlens 30 corresponding to one pixel is formed, while with respect to the phase difference detection pixels 40L and 40R, one microlens 30A corresponding to two pixels is formed. That is, the microlens 30A is formed as a lens of two pixels. It should be noted that the microlens 30A is formed of, for example, a transparent material having a refractive index 1.45 as with the microlens 30.

The above structure permits sensitivity of the phase difference detection pixels to be significantly improved.

Figure 5:
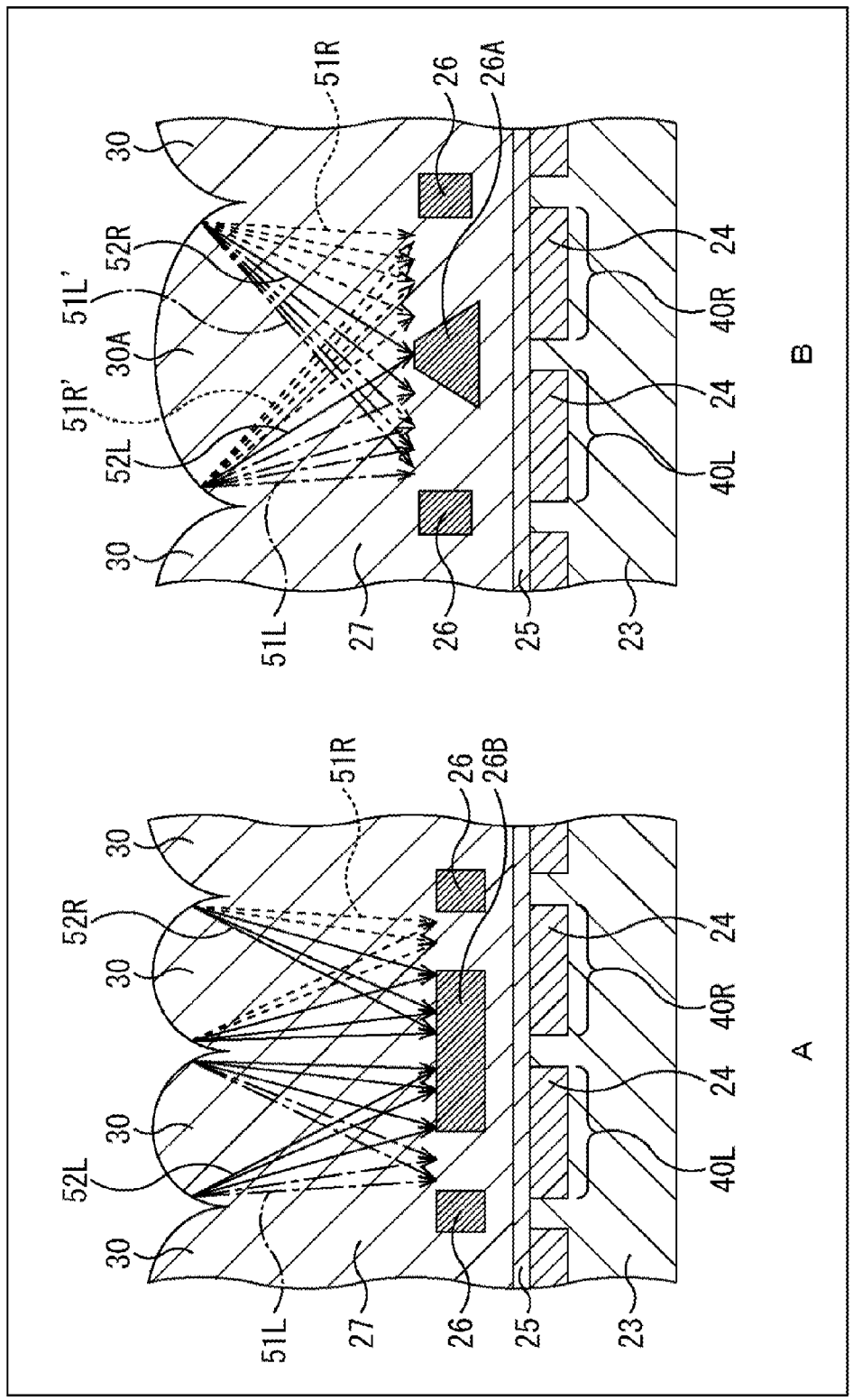
FIG. 5 is a diagram describing an isolation capability of the phase difference detection pixels.

Specifically, in a solid-state imaging apparatus in the past, as shown in FIG. 5A, an isolation structure 26B which isolates light entering the phase difference detection pixels 40L and 40R has been formed so as to cover a half of a light-receiving surface of the photodiodes 24. Further, the microlenses 30 have been formed over the phase difference detection pixels 40L and 40R, respectively.

With such a structure, in the phase difference detection pixel 40L, light 51L which is about half of the light entering from the left side of the pupil surface enters the photodiodes 24. However, the rest of light 52L is shielded by the isolation structure 26B. Likewise, in the phase difference detection pixel 40R, light 51R which is about half of the light entering from the right side of the pupil surface enters the photodiodes 24. However, the rest of light 52R is shielded by the isolation structure 26B.

Meanwhile, in the solid-state imaging apparatus according to an embodiment of the present technology, as shown in FIG. 5B, the isolation structure 26A which isolates light entering the phase difference detection pixels 40L and 40R is formed so as to have an inclined side wall surface whose cross section is tapered. Further, one microlens 30 is formed over the phase difference detection pixels 40L and 40R.

With such a structure, in the phase difference detection pixel 40L, in addition to the light 51L which is about half of the light entering from the left side of the pupil surface, light 51l' which is about half of the light entering from the right side of the pupil surface, enters the photodiodes 24. Likewise, in the phase difference detection pixel 40R, in addition to the light 51R which is about half of the light entering from the right side of the pupil surface, light 51R' which is about half of the light entering from the left side of the pupil surface enters the photodiodes 24.

With such a structure, the light which has been shielded in the past is distributed into the adjacent phase difference detection pixels and enters the adjacent phase difference detection pixels, so that sensitivity of the phase difference detection pixels can be significantly improved and even when the pixel size reduces, the accuracy of the AF can be prevented from being decreased.

Moreover, a light amount entering the photodiodes 24 can be adjusted by changing a shape of the isolation structure 26A and a shape of the microlens 30A, so that an isolation capability of the phase difference detection pixels (a function of selectively receiving an incidence angle of light entering an image surface) can be optimally improved.

<Flow of Forming Pixel>

Figure 6:
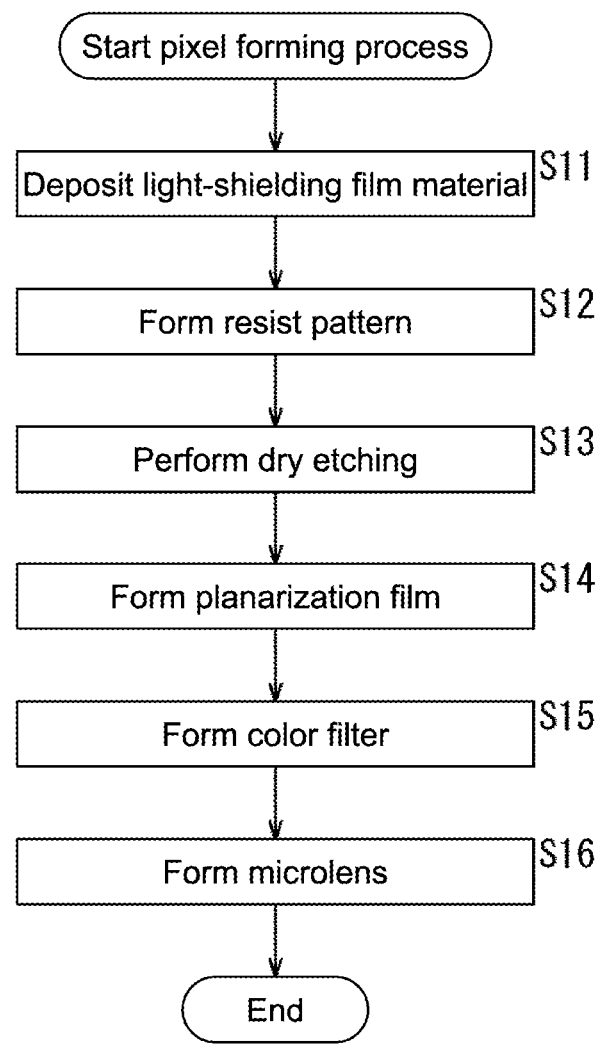
FIG. 6 is a flowchart describing an example of a pixel forming process.
Figure 7:
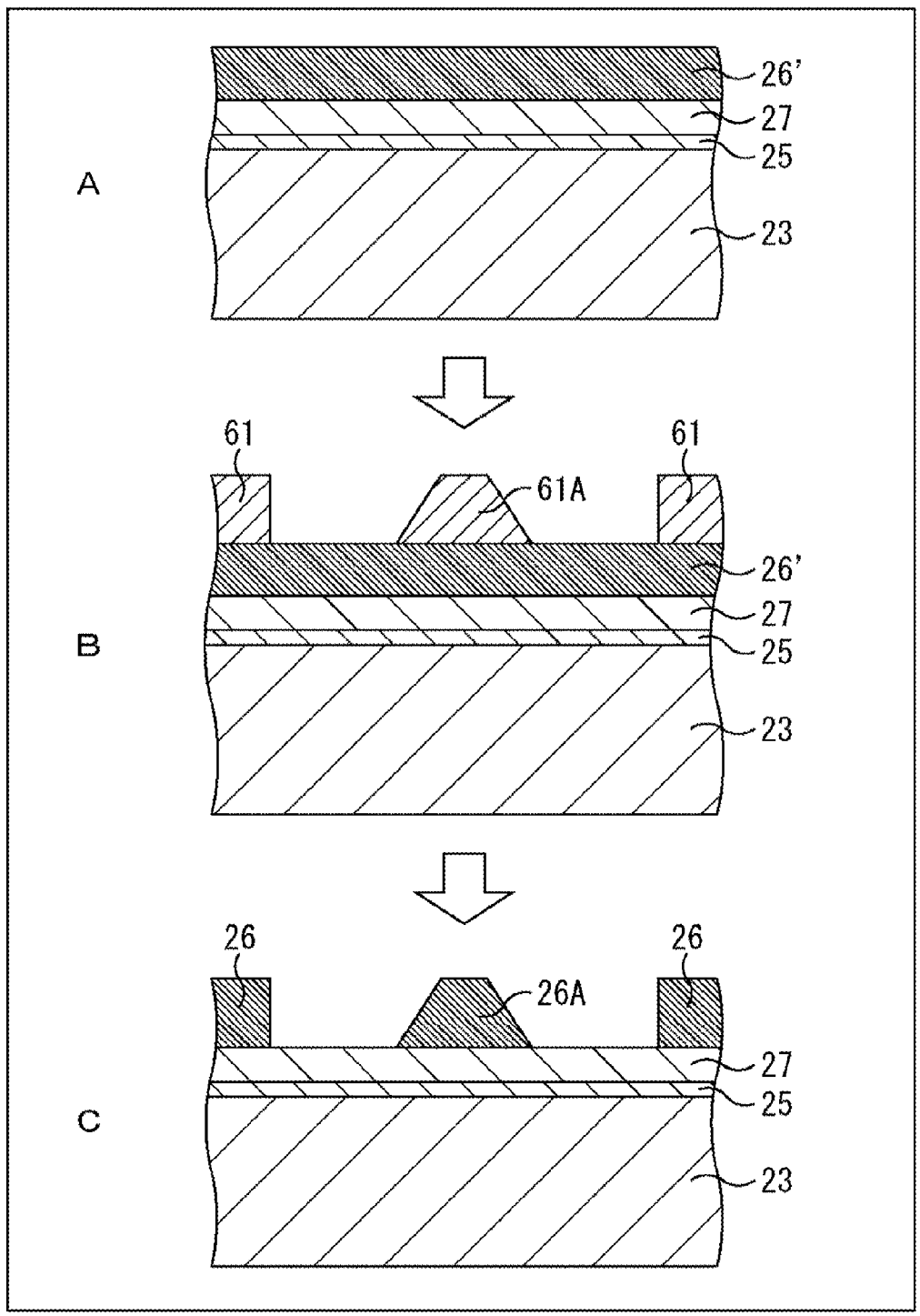
FIG. 7 is a diagram showing a step of forming a pixel.

Next, referring to FIGS. 6 and 7, a description will be given on a flow of forming a pixel of the solid-state imaging apparatus according to an embodiment of the present technology. FIG. 6 is a flowchart describing a pixel forming process, and FIG. 7 is a cross-sectional view showing a step of forming a pixel.

It should be noted that in the following, a description will be given on a process after the planarization film 27 is formed over the protection film 25.

Firstly, in step S11, a light-shielding film material is deposited. Specifically, as shown in FIG. 7A, over the planarization film 27, a light-shielding film material 26' using W and the like is deposited, for example. It should be noted that in FIG. 7, an illustration of the photodiodes 24 is omitted.

In step S12, a resist pattern is formed. Specifically, as shown in FIG. 7B, over the light-shielding film material 26', a photoresist pattern 61 for forming the light-shielding film 26 and a photoresist pattern 61A for forming the isolation structure 26A are formed. The photoresist pattern 61A is formed so as to have an inclined side wall surface whose cross section is tapered.

In step S13, the photoresist patterns 61 and 61A are transferred by etching the light-shielding film material 26' formed as an underlying layer thereof, so that a dry etching process is performed. Therefore, as shown in FIG. 7C, the isolation structure 26A having an inclined side wall surface whose cross section is tapered is formed, together with the light-shielding film 26.

Then, in step S14, over the light-shielding film 26 and the isolation structure 26A, the planarization film 27 is formed.

In step S15, over the planarization film 27, a color filer layer 28 is formed. It should be noted that the color filer layer 28 is not formed in the pixel region corresponding to the phase difference detection pixels.

Further, in step S16, over the first organic material layer 29 formed over the planarization film 27, the microlenses 30 and 30A are formed.

According to the above described processes, the isolation structure 26A which isolates light entering the phase difference detection pixels 40L and 40R is formed to have an inclined side wall surface whose cross section is tapered, and the microlens 30A corresponding to the phase difference detection pixels 40L and 40R is formed. Therefore, the light which has been shielded in the past is distributed into the adjacent phase difference detection pixels and enters the adjacent phase difference detection pixels, so that sensitivity of the phase difference detection pixels can be significantly improved and even when the pixel size reduces, the accuracy of the AF can be prevented from being decreased.

<Isolation Capability of Phase Difference Detection Pixel>

As described above, since the shape of the isolation structure 26A and the shape of the microlens 30A are changed, the isolation capability of the phase difference detection pixels can be optimally improved. Accordingly, hereinafter, a description will be given in detail on a change in the isolation capability of the phase difference detection pixels when the shape of the isolation structure 26A and the shape of the microlens 30A are changed.

Figure 8:
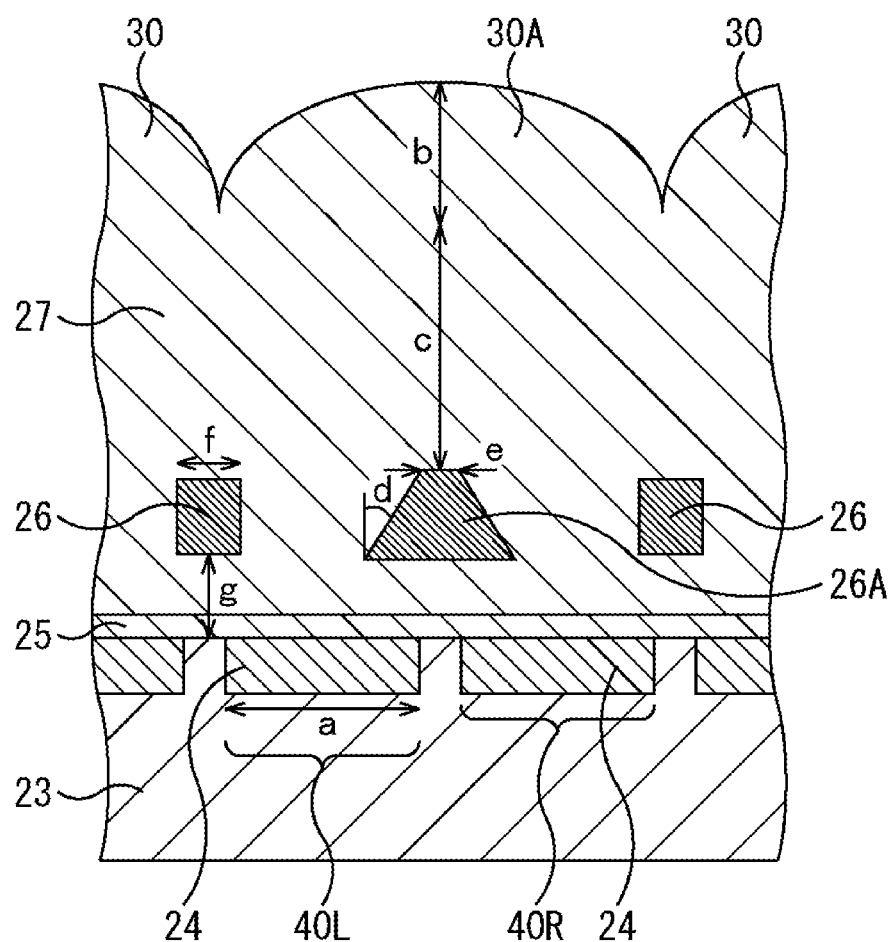
FIG. 8 is a diagram describing various parameters of the phase difference detection pixels.

As with FIG. 3, FIG. 8 is a cross-sectional view of the phase difference detection pixels 40L and 40R according to an embodiment of the present technology and a view describing various parameters of the phase difference detection pixels 40L and 40R.

In FIG. 8, a represents a pixel size, b represents a thickness of the microlens 30A, and c represents a distance between the microlens 30A and the isolation structure 26A. Moreover, d represents an inclination angle of the side wall surface of the isolation structure 26A, and e represents a width (line width) of an upper surface of the isolation structure 26A. Further, f represents a line width of the light-shielding film 26, and g represents a distance between the isolation structure 26A (light-shielding film 26) and surfaces of the photodiodes 24 (silicon substrate 23).

First Embodiment

Firstly, a description will be given on the isolation capability of the phase difference detection pixels when an inclination angle d of the side wall surface of the isolation structure 26A is caused to be changed.

Figure 9:
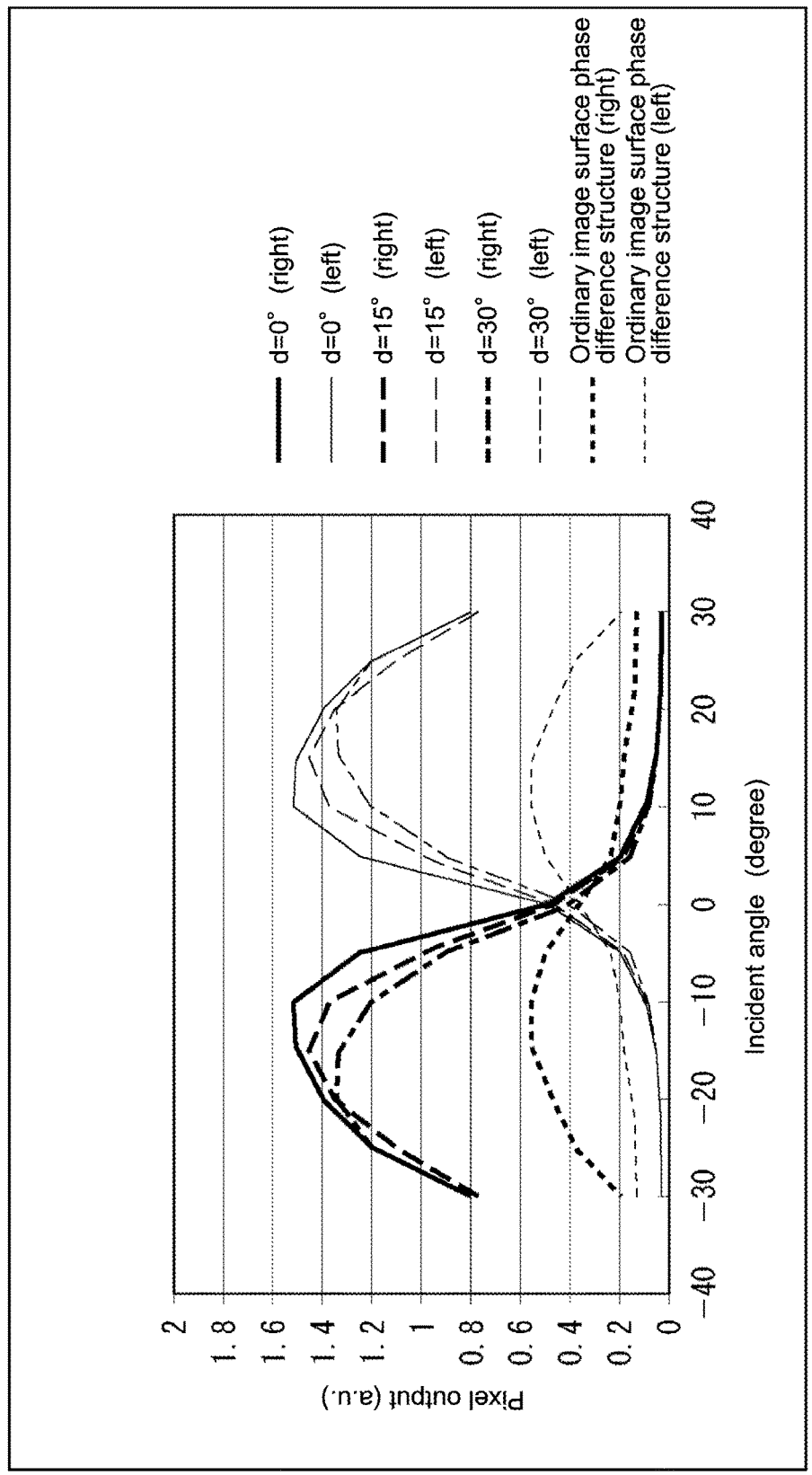
FIG. 9 is a diagram showing an isolation property of the phase difference detection pixels.

Here, parameters other than the inclination angle d of the side wall surface of the isolation structure 26A are described as follows:

Pixel size a: 1.12 µm
Thickness b of microlens 30A: 1000 nm
Distance c between microlens 30A and isolation structure 26A: 1000 nm
Line width e of isolation structure 26A: 100 nm
Line width f of light-shielding film 26: 200 nm
Distance g between isolation structure 26A and surface of silicon substrate 23: 100 nm Under this condition, FIG. 9 shows an isolation property of the phase difference detection pixels 40L and 40R when the inclination angle d of the side wall surface of the isolation structure 26A is set as 0°, 15°, and 30°.

In a graph in FIG. 9, a vertical axis represents an incident angle of incident light, and a horizontal axis represents a pixel output of the phase difference detection pixels 40L and 40R. FIG. 9 shows a property of the phase difference detection pixels in the past, in addition to the property when d is equal to 0°, 15°, and 30° in the phase difference detection pixels according to the present embodiment.

As shown in this graph, in the phase difference detection pixel 40R arranged on the right side, the output (sensitivity) increases when incident light is angled on the left side (minus side), and in the phase difference detection pixel 40L arranged on the left side, the output (sensitivity) increases when incident light is angled on the right side (plus side).

As shown in FIG. 9, the phase difference detection pixels according to the present embodiment have not only sufficient sensitivity, but also a favorable isolation property in comparison with the phase difference detection pixels in the past even when d is any of 0°, 15°, and 30°. That is, the inclination angle d of the side wall surface of the isolation structure 26A is adjusted and formed in accordance with a desirable isolation property of the phase difference detection pixels 40L and 40R.

Second Embodiment

Next, a description will be given on the isolation capability of the phase difference detection pixels when the line width e of the isolation structure 26A is caused to be changed.

Figure 10:
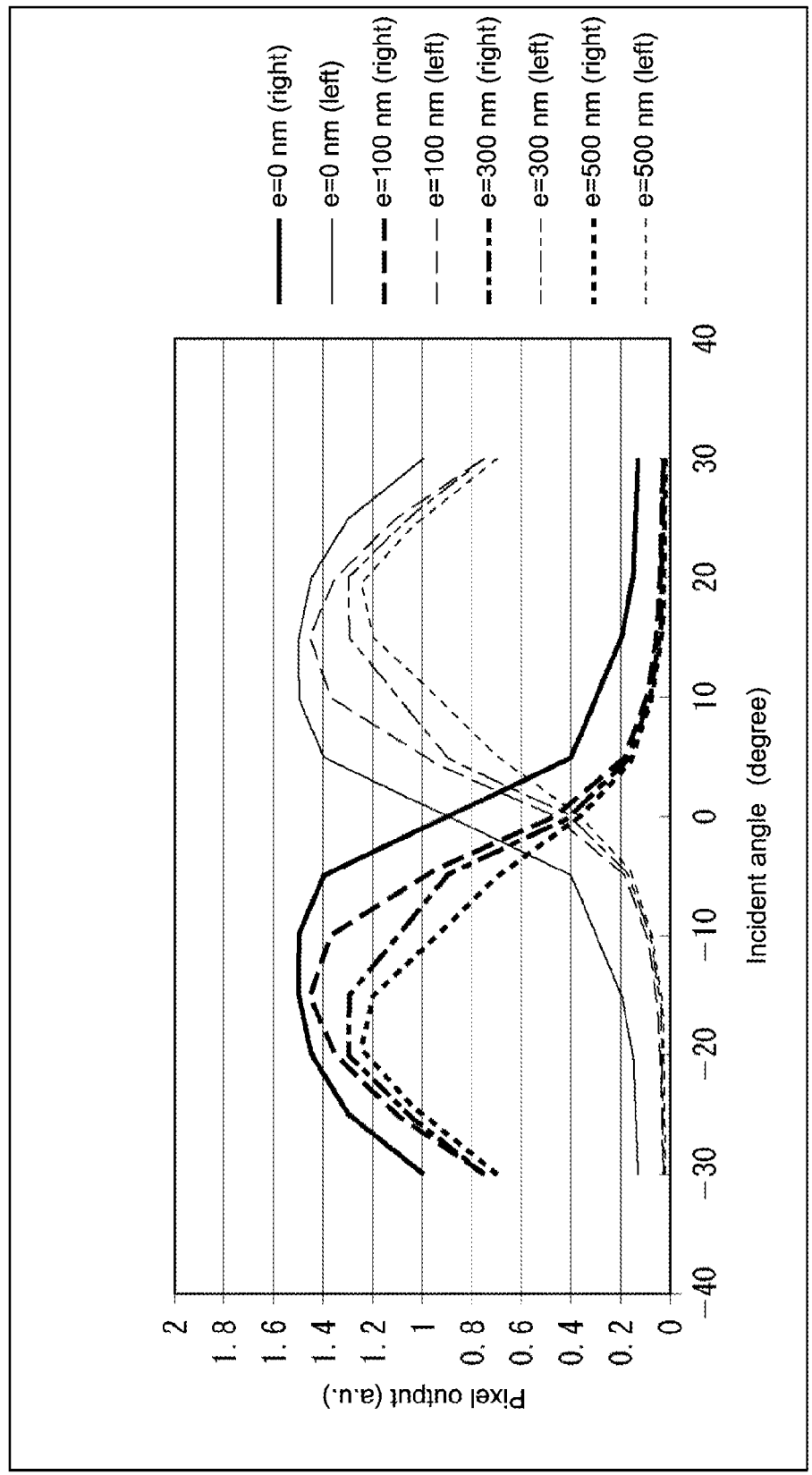
FIG. 10 is a diagram showing the isolation property of the phase difference detection pixels.

Here, parameters other than the line width e of the isolation structure 26A are described as follows:

Pixel size a: 1.12 µm
Thickness b of microlens 30A: 1000 nm
Distance c between microlens 30A and isolation structure 26A: 1000 nm
Inclination angle d of side wall surface of isolation structure 26A: 15°
Line width f of light-shielding film 26: 200 nm
Distance g between isolation structure 26A and surface of silicon substrate 23: 100 nm Under this condition, FIG. 10 shows an isolation property of the phase difference detection pixels 40L and 40R when the line width e of the isolation structure 26A is set as 0 nm, 100 nm, 300 nm, and 500 nm.

As shown in FIG. 10, the phase difference detection pixels according to the present embodiment have not only sufficient sensitivity, but also a favorable isolation property even when e is any of 0 nm, 100 nm, 300 nm, and 500 nm. That is, the line width e of the isolation structure 26A is adjusted and formed in accordance with a desirable isolation property of the phase difference detection pixels 40L and 40R.

In particular, in the line width of the isolation structure 26A, sensitivity to light near an incident angle 0° including vertically incident light can be caused to be changed, so that it is useful as a parameter used for a design of the isolation capability. Generally, it is desirable that incident angles at which outputs of phase difference detection pixels become a peak value in an isolation property be near 5° to 15°, and that outputs of phase difference detection pixels with respect to vertically incident light (incident angle 0°) be equal to or lower than half of the peak value. Therefore, according to the present embodiment, more suitable isolation property can be obtained when the line width e of the isolation structure 26A is set as around 100 nm to 300 nm (10% to 30% of pixel size).

Third Embodiment

Next, a description will be given on the isolation capability of the phase difference detection pixels when the thickness b of the microlens 30A and the distance c between the microlens 30A and the isolation structure 26A are caused to be changed.

Here, parameters other than thickness b and the distance c are described as follows:

Pixel size a: 1.12 µm
Inclination angle d of side wall surface of isolation structure 26A: 15°
Line width e of isolation structure 26A: 100 nm
Line width f of light-shielding film 26: 200 nm
Distance g between isolation structure 26A and surface of silicon substrate 23: 100 nm Under this condition, FIG. 11A shows an isolation property of the phase difference detection pixels 40L and 40R when the thickness b of the microlens 30A is set as 500 nm, and the distance c between the microlens 30A and the isolation structure 26A is set as 500 nm, 1000 nm, and 1500 nm. Likewise, FIGS. 11B and 11C show isolation properties of the phase difference detection pixels 40L and 40R when the thickness b of the microlens 30A is set as 1000 nm and 1500 nm.

Figure 11:
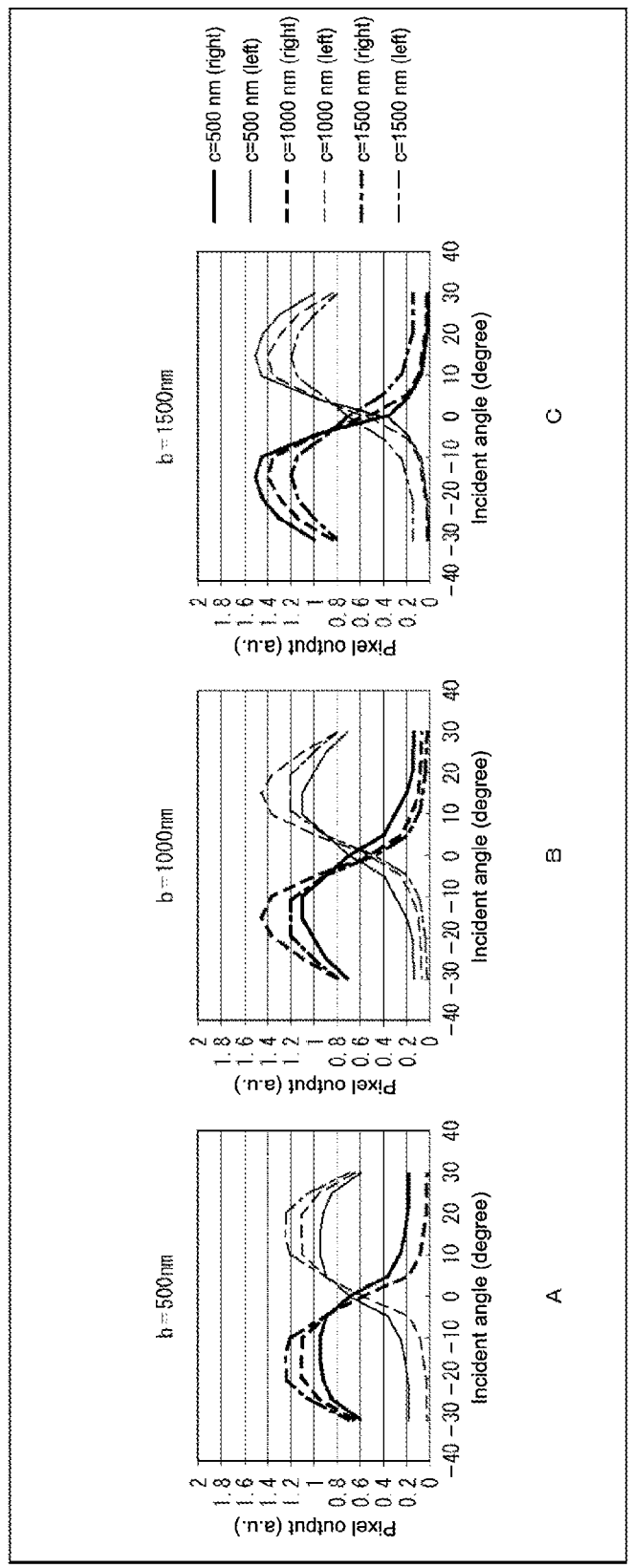
FIG. 11 is a diagram showing the isolation property of the phase difference detection pixels.

As shown in FIG. 11, the distance c between the microlens 30A and the isolation structure 26A so that the isolation capability is favorable is different due to the thickness b of the microlens 30A. That is, the optimal distance c between the microlens 30A and the isolation structure 26A is determined in accordance with a lens power.

Figure 12:
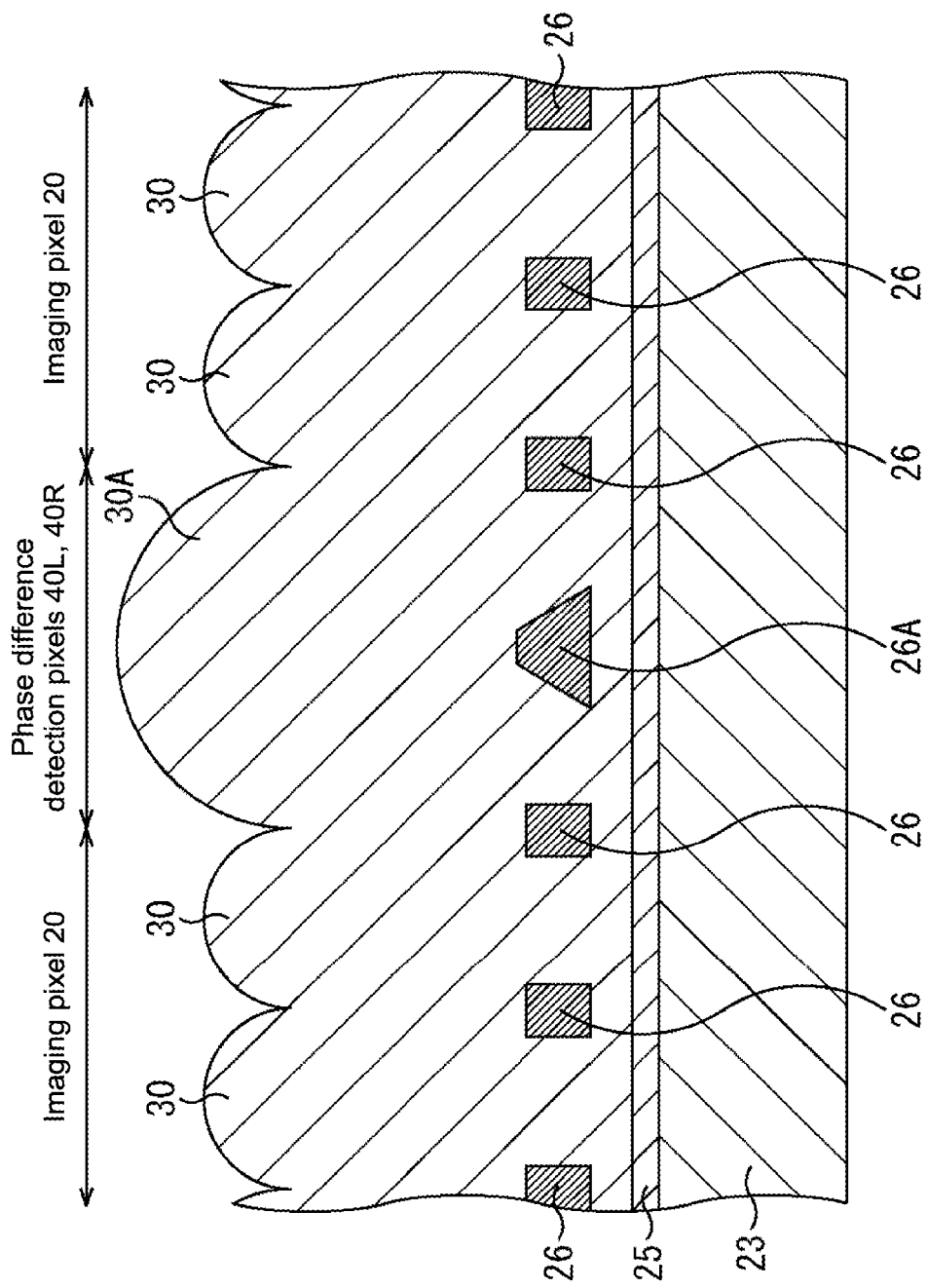
FIG. 12 is a diagram describing a lens power of a microlens.

As described above, since the phase difference detection pixels are arranged in the form of being mixed in the imaging pixels in the pixel region, it is desirable that the phase difference detection pixels and the imaging pixels be manufactured under the same step. Here, with respect to the imaging pixels, when both the optimal thickness of the microlens 30A and the optimal distance between the microlens 30 and the light-shielding film 26 are set as 500 nm, it is desirable that the distance c between the microlens 30A and the isolation structure 26A be set as 500 nm from the viewpoint of the manufacturing step. In this case, as shown in the isolation property of FIG. 11C, the isolation property is optimal when the thickness b of the microlens 30A is set as 1500 nm. Therefore, when the height of the imaging pixels 20 and the phase difference detection pixels 40L and 40R is identical, the microlens 30A is formed so that a lens power is larger than the microlens 30 corresponding to the imaging pixels 20 as shown in FIG. 12.

The foregoing description has been explained for the configuration that the shape of the isolation structure 26A and the shape of the microlens 30A are changed to improve the isolation capability of the phase difference detection pixels. Alternatively, other configuration may improve the isolation capability of the phase difference detection pixels.

Fourth Embodiment

Figure 13:
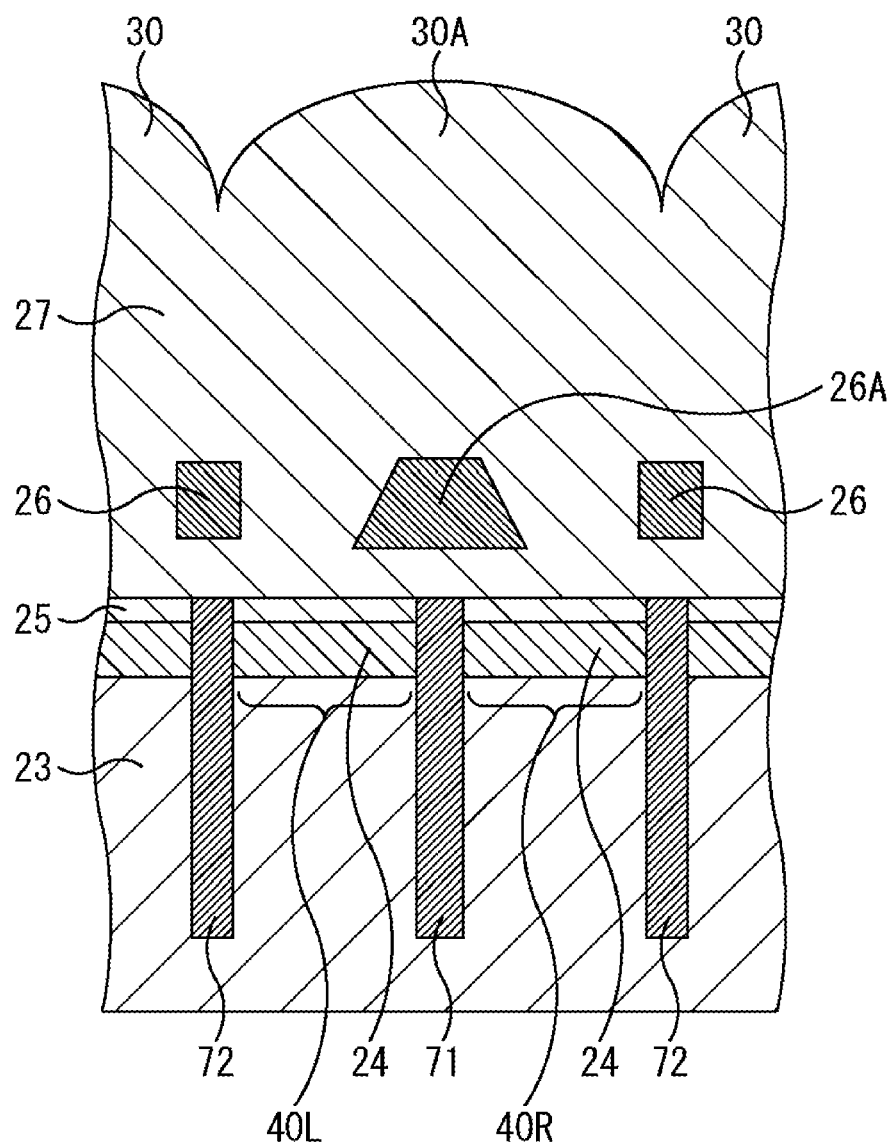
FIG. 13 is a cross-sectional view showing another structure example of the phase difference detection pixels.

FIG. 13 shows a cross-sectional view of the phase difference detection pixels 40L and 40R so as to improve the isolation capability of the phase difference detection pixels.

In a structure of FIG. 13, a trench 71 is formed in a boundary (element isolation region) between the photodiodes 24 of the phase difference detection pixels 40L and 40R of the silicon substrate 23, in addition to the structure of FIG. 3. Further, trenches 72 are formed between the photodiodes 24 of the imaging pixels adjacent to the phase difference detection pixel 40L and between the photodiodes 24 of the imaging pixels adjacent to the phase difference detection pixel 40R, respectively.

Into the trench 71 and the trenches 72 formed over the silicon substrate 23, SiO is embedded, for example. Alternatively, a metal such as W and Al may be embedded into them.

Figure 14:
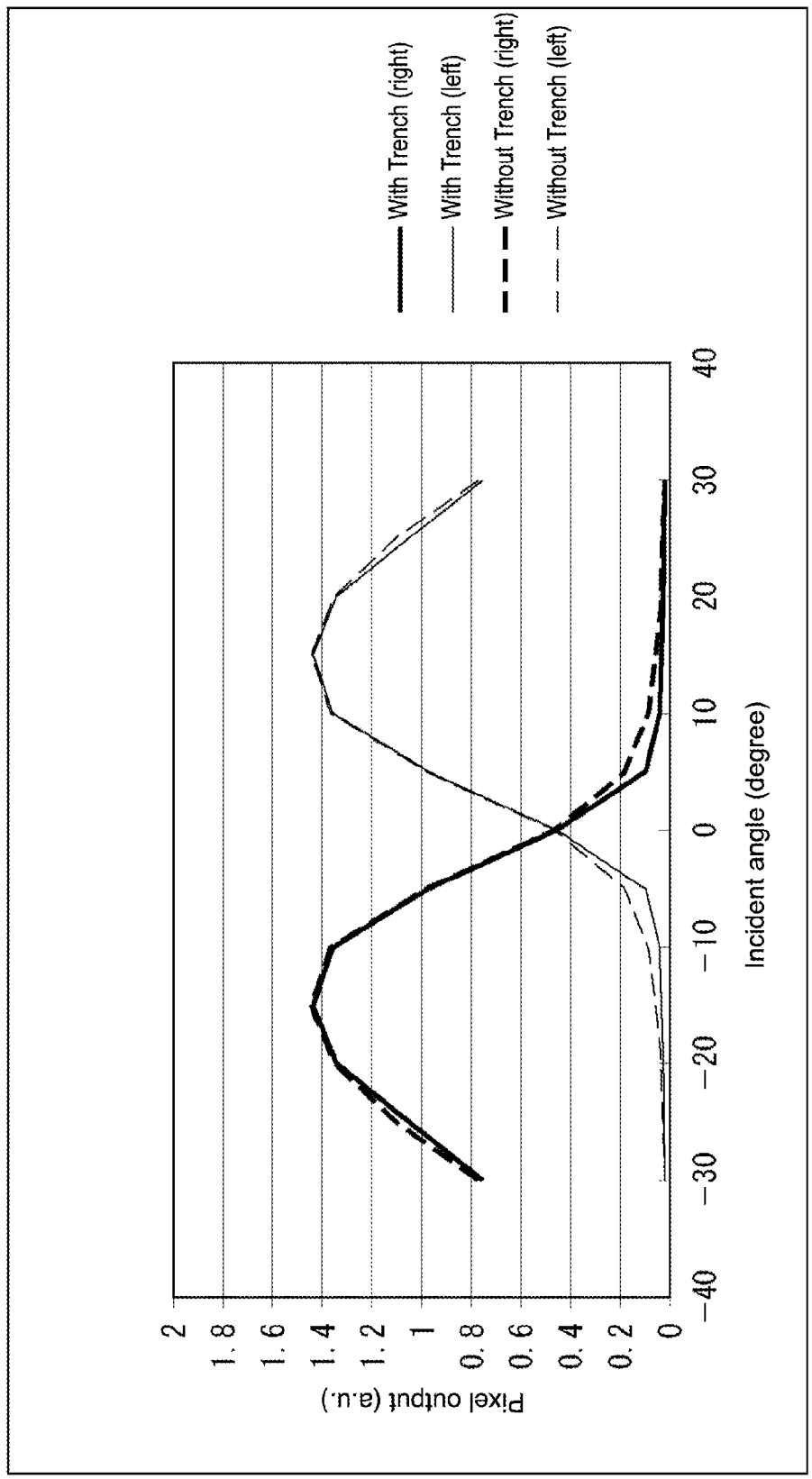
FIG. 14 is a diagram showing the isolation property of the phase difference detection pixels.

Here, various parameters are described as follows:
Pixel size a: 1.12 μm
Thickness b of microlens 30A: 1000 nm
Distance c between microlens 30A and isolation structure 26A: 1000 nm
Inclination angle d of side wall surface of isolation structure 26A: 15°
Line width e of isolation structure 26A: 100 nm
Line width f of light-shielding film 26: 200 nm
Distance g between isolation structure 26A and surface of silicon substrate 23: 100 nm
In addition to such a condition, FIG. 14 shows an isolation property of the phase difference detection pixels 40L and 40R when the line width of the trenches 71 and 72 is set as 100 nm. In FIG. 14, a property when the trenches 71 and 72 are not provided is shown, in addition to the property when the trenches 71 and 72 are provided.

As shown in FIG. 14, when the trenches 71 and 72 are provided, the phase difference detection pixels slightly improve the isolation property in comparison with the phase difference detection pixels when the trenches 71 and 72 are not provided.

Moreover, according to the structure in FIG. 13, the trench 71 can prevent a color mixture between the adjacent phase difference detection pixels 40L and 40R, and the trench 72 can prevent the color mixture between the phase difference detection pixels 40L and 40R and the adjacent imaging pixels 20.

It should be noted that the structure according to the present embodiment can be applied to the phase difference detection pixels according to the above described other embodiments.

Meanwhile, in the solid-state imaging apparatus according to an embodiment of the present technology, incident light is reflected on a surface of the isolation structure 26A disposed between the phase difference detection pixels 40L and 40R, so that signal leakages to the adjacent imaging pixels 20 and a ghost may occur.

Fifth Embodiment

Figure 15:
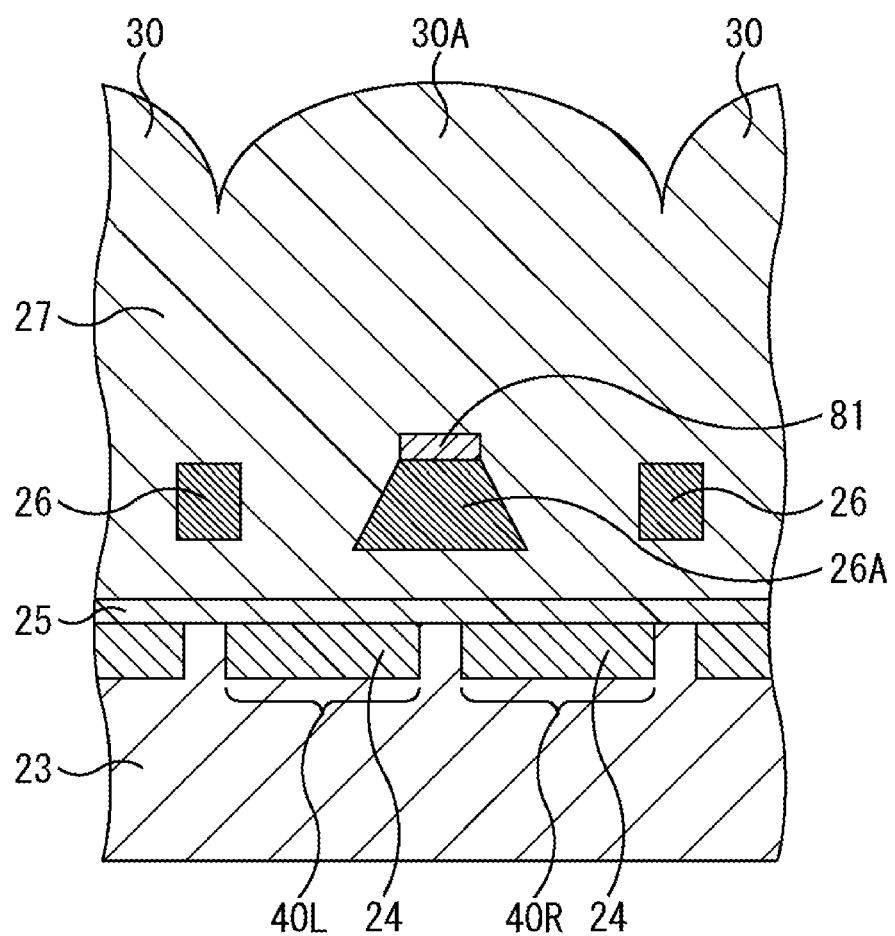
FIG. 15 is a cross-sectional view showing still another structure example of the phase difference detection pixels.

FIG. 15 shows a cross-sectional view of the phase difference detection pixels 40L and 40R so as to suppress signal leakages to the adjacent imaging pixels and the ghost.

In the structure of FIG. 15, over the upper surface of the isolation structure 26A, an antireflection film 81 is formed, in addition to the structure of FIG. 3.

The antireflection film 81 is formed of SiN, SiON, TaO, HfO, AlO, and the like, the film thinness of which is set to 60 nm, for example. Moreover, the antireflection film 81 may be formed as a single-layer film or multiple-layer films. When the antireflection film 81 is formed as the multiple-layer films, SiO is interposed between the layers.

It should be noted that in the example in FIG. 15, the antireflection film 81 is formed only on the upper surface of the isolation structure 26A. Alternatively, the antireflection film 81 is formed on the side wall surface of the isolation structure 26A.

Figure 16:
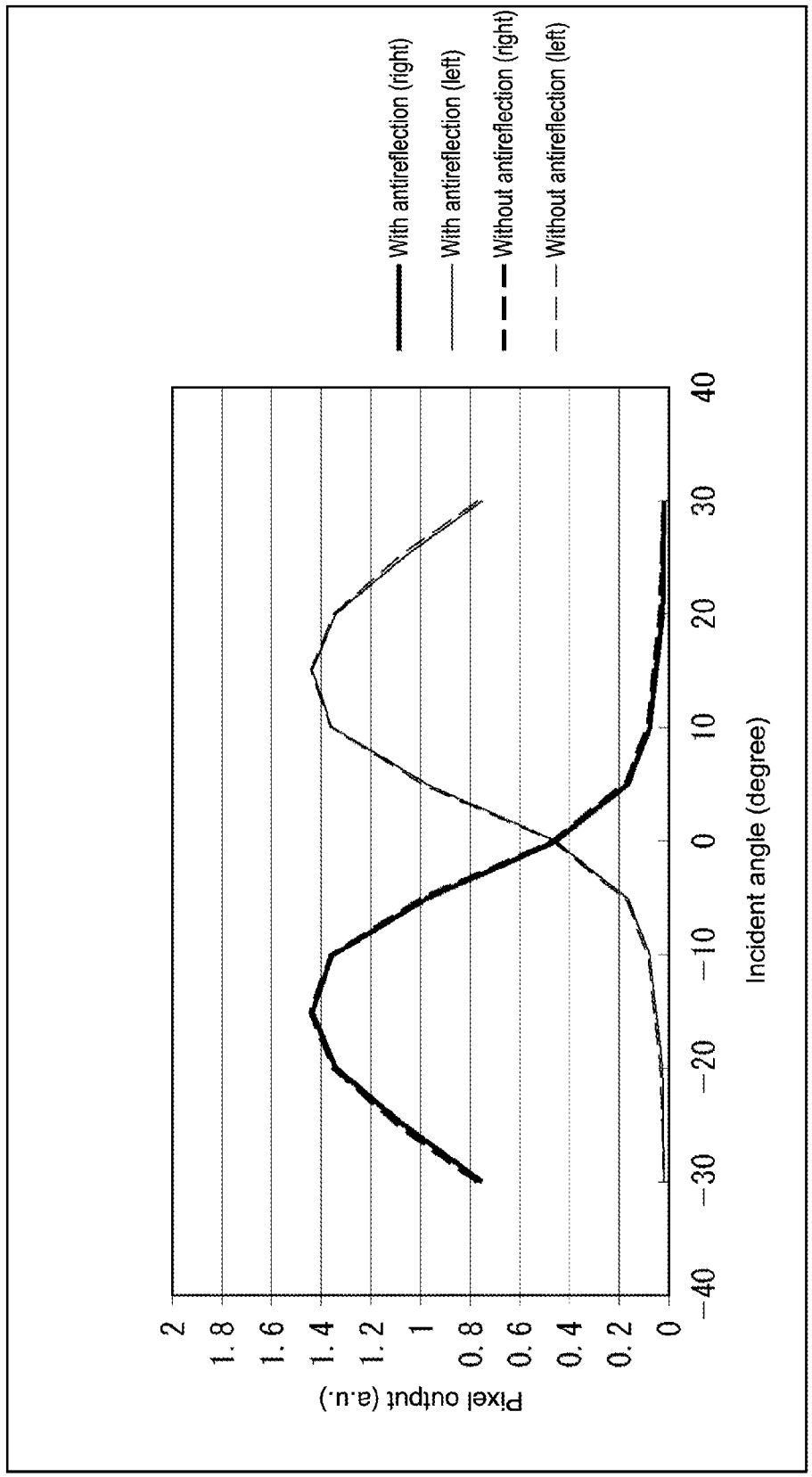
FIG. 16 is a diagram showing the isolation property of the phase difference detection pixels.

Here, various parameters are described as follows:
Pixel size a: 1.12 μm
Thickness b of microlens 30A: 1000 nm
Distance c between microlens 30A and isolation structure 26A: 1000 nm
Inclination angle d of side wall surface of isolation structure 26A: 15°
Line width e of isolation structure 26A: 100 nm
Line width f of light-shielding film 26: 200 nm
Distance g between isolation structure 26A and surface of silicon substrate 23: 100 nm
Under this condition, FIG. 16 shows the isolation property of the phase difference detection pixels 40L and 40R. In FIG. 16, a property when the antireflection film 81 is not provided is shown, in addition to the property when the antireflection film 81 is provided.

As shown in FIG. 16, there is little difference in the isolation property between the phase difference detection pixels when the antireflection film 81 is provided and the phase difference detection pixels when the antireflection film 81 is not provided.

Figure 17:
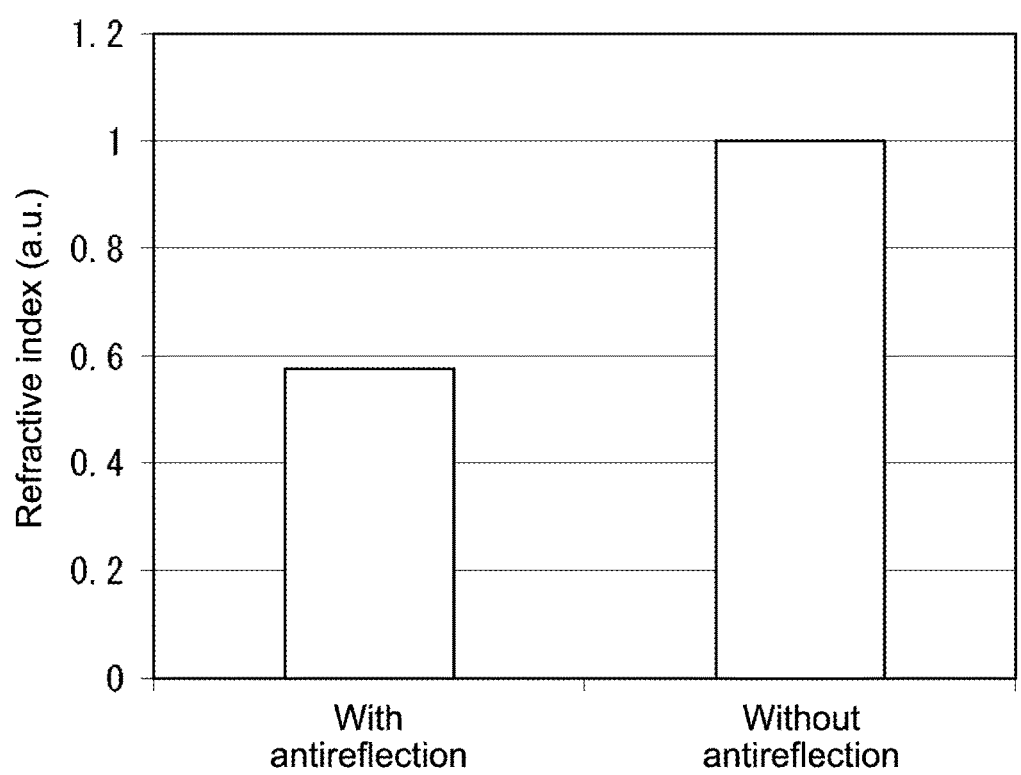
FIG. 17 is a diagram describing of a reflectance of the phase difference detection pixels.

However, as shown in FIG. 17, the phase difference detection pixels when the antireflection film 81 is provided can suppress a reflectance in the phase difference detection pixels by around 40% in comparison with the case of the phase difference detection pixels when the antireflection film 81 is not provided. Therefore, it is possible to suppress signal leakages to the adjacent imaging pixels and the ghost.

It should be noted that the structure according to the present embodiment can be applied to the phase difference detection pixels according to the above described other embodiments.

In the foregoing description, the isolation structure 26A is formed of the same material as the light-shielding film 26, but may be formed of other materials.

Sixth Embodiment

Figure 18:
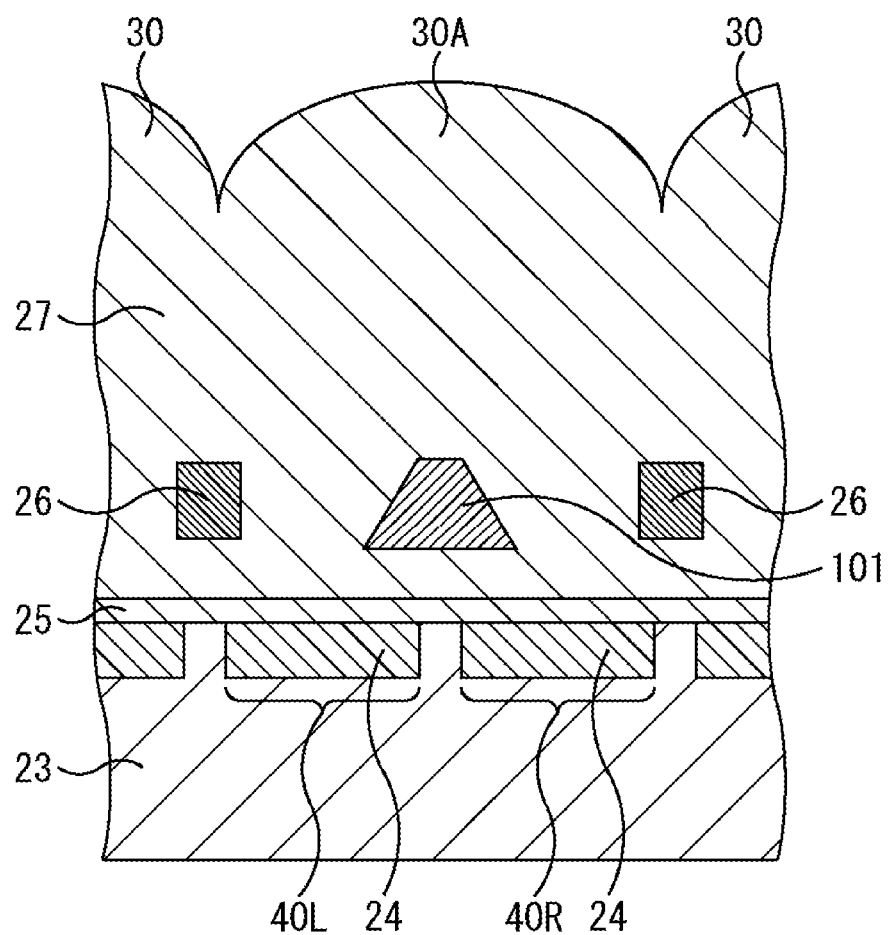
FIG. 18 is a cross-sectional view showing still another structure example of the phase difference detection pixels.

FIG. 18 shows a cross-sectional view of the phase difference detection pixels 40L and 40R so that the isolation structure is formed of a material different from that of the light-shielding film.

In the structure of FIG. 18, an isolation structure 101 using a transparent material having a refractive index of generally one is formed, in place of the isolation structure 26A in the structure of FIG. 3. Specifically, the isolation structure 101 is vacuum-formed or air-formed.

Here, various parameters are described as follows:
Pixel size a: 1.12 µm
Thickness b of microlens 30A: 1000 nm
Distance c between microlens 30A and isolation structure 26A: 1000 nm
Inclination angle d of side wall surface of isolation structure 101: 15°
Line width e of isolation structure 101: 100 nm
Line width f of light-shielding film 26: 200 nm
Distance g between isolation structure 101 and surface of silicon substrate 23: 100 nm Under this condition, FIG. 19 shows the isolation property of the phase difference detection pixels 40L and 40R.

Figure 19:
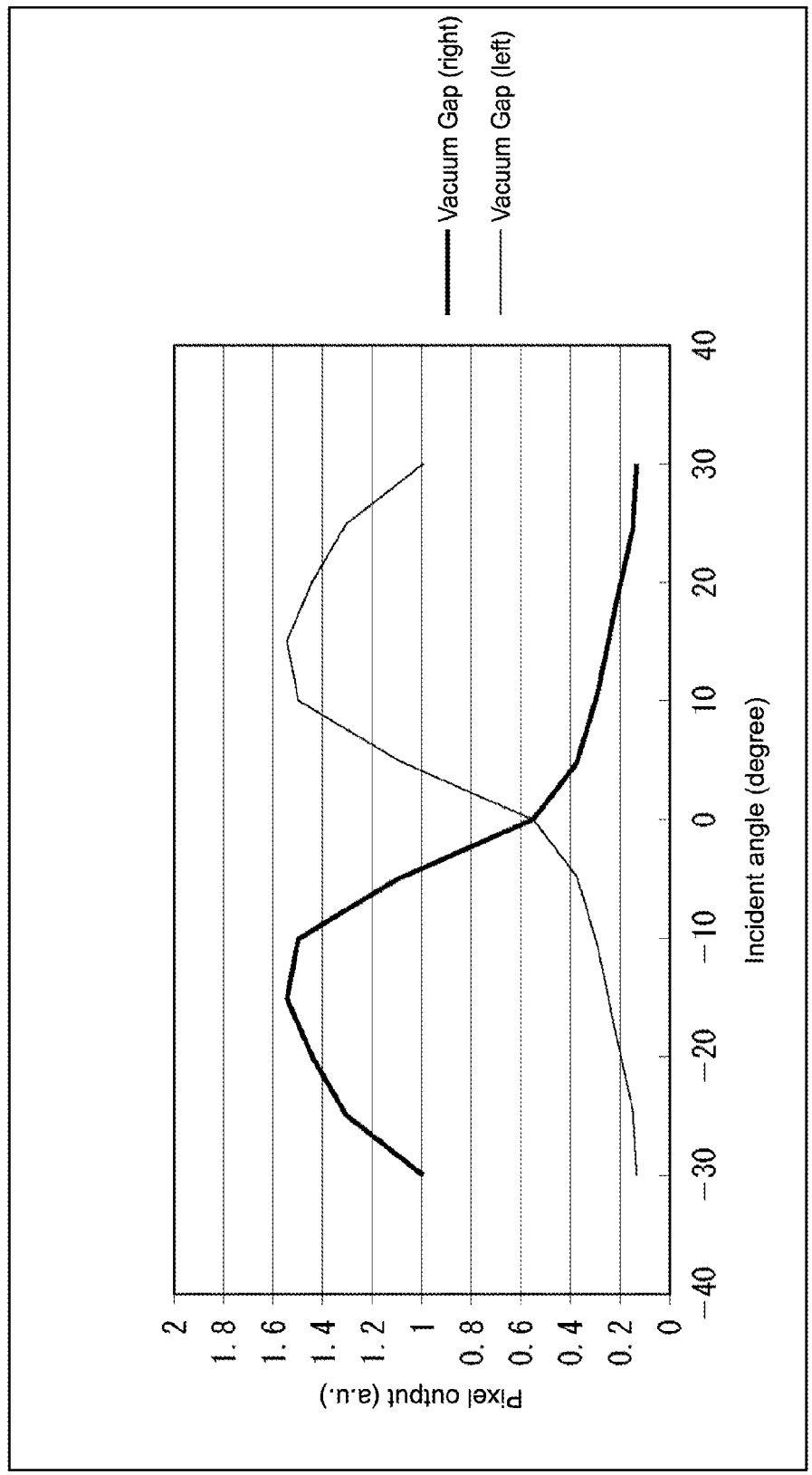
FIG. 19 is a diagram showing the isolation property of the phase difference detection pixels.

According to the structure of the phase difference detection pixels of the present embodiment, incident light is selectively guided to the right and left photodiodes 24 due to the difference between the refractive index of the isolation structure 101 and the refractive index of a material surrounding thereof (planarization film 27), so that a favorable isolation property can be obtained as shown in FIG. 19.

It should be noted that since a favorable isolation property can be obtained if there is a difference between the refractive index of the isolation structure 101 and the refractive index of the material surrounding thereof, a material with a low refractive index can be used as a material of the isolation structure 101. Specifically, the isolation structure 101 may be formed of a transparent dielectric using SiOC (refractive index 1.4) and porous SiOC (refractive index 1.33) and the like.

Figure 20:
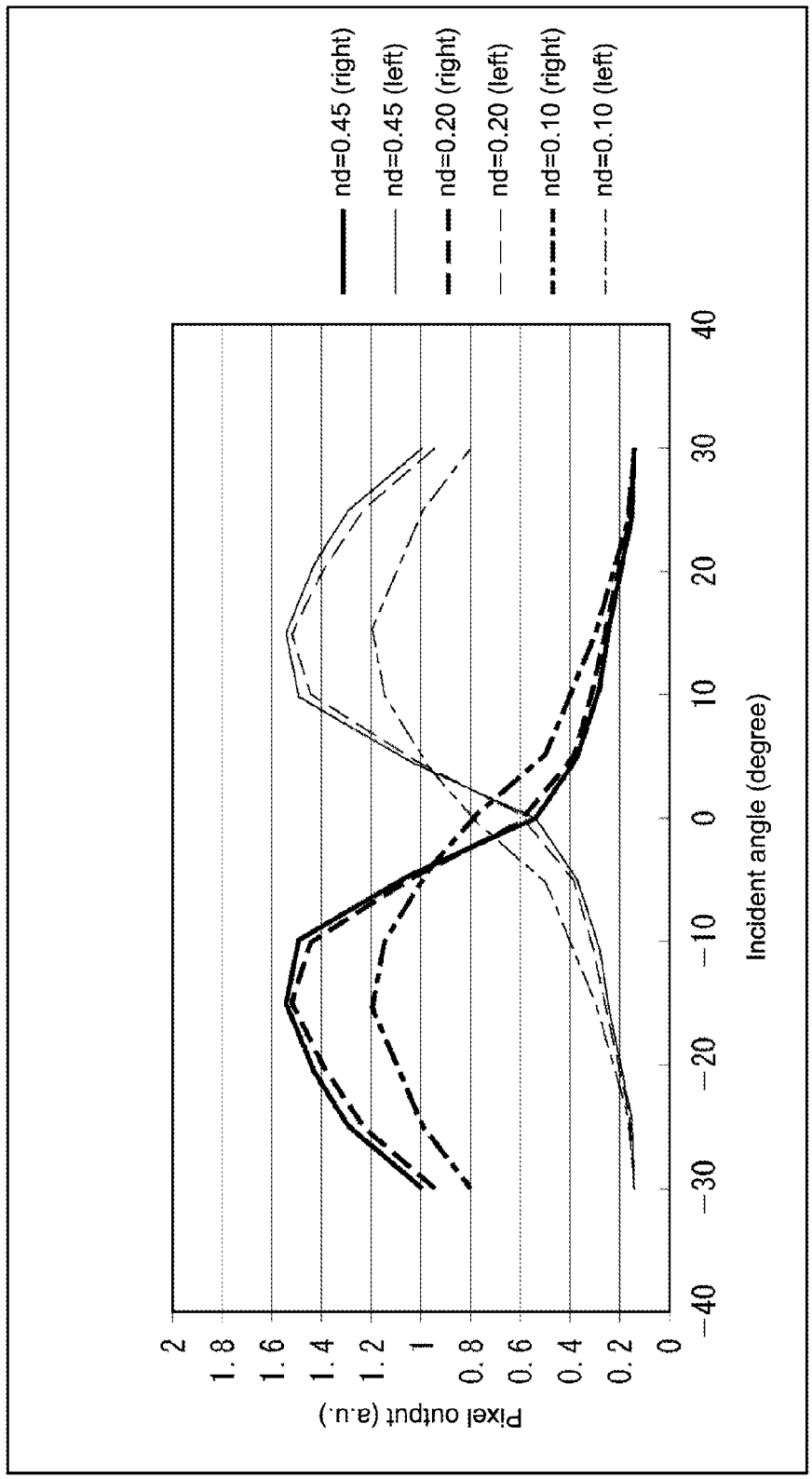
FIG. 20 is a diagram showing the isolation property of the phase difference detection pixels.

Here, FIG. 20 shows an isolation property of the phase difference detection pixels 40L and 40R when a refractive index difference nd between the refractive index of the isolation structure 101 and the refractive index of the material surrounding thereof is set to 0.45, 0.20, and 0.10.

As shown in FIG. 20, the isolation property is changed due to the refractive index difference nd, but it is difficult to obtain a favorable isolation property in the case of nd=0.10. When the refractive index difference nd is 0.20 or more, a favorable isolation property can be obtained.

It should be noted that the structure according to the present embodiment can be applied to the phase difference detection pixels according to the above described other embodiments.

<Flow of Forming Pixel>

Figure 21:
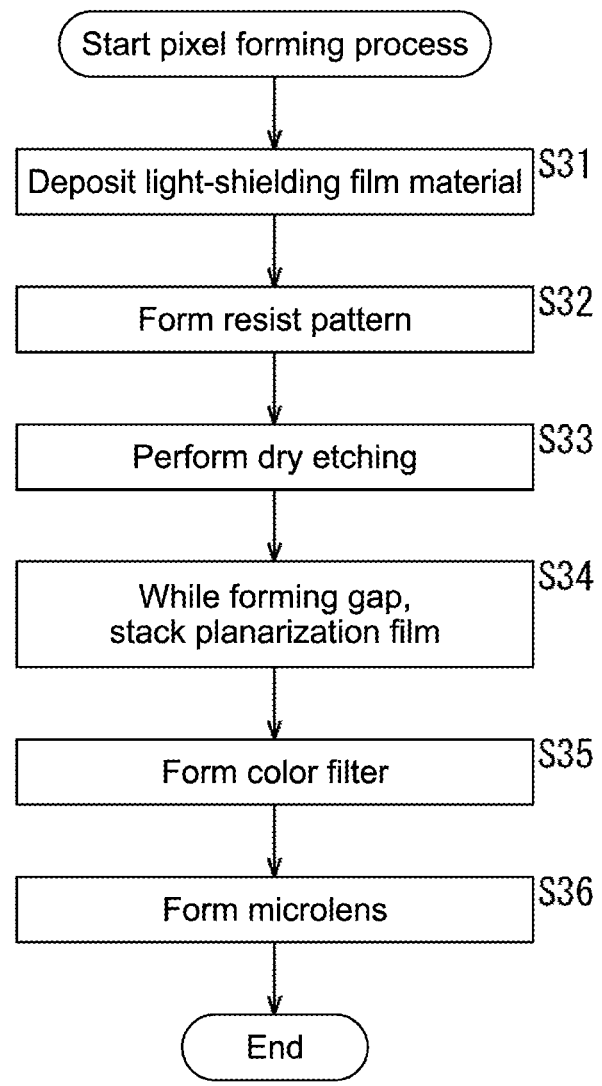
FIG. 21 is a flowchart describing another example of the pixel forming process.
Figure 22:
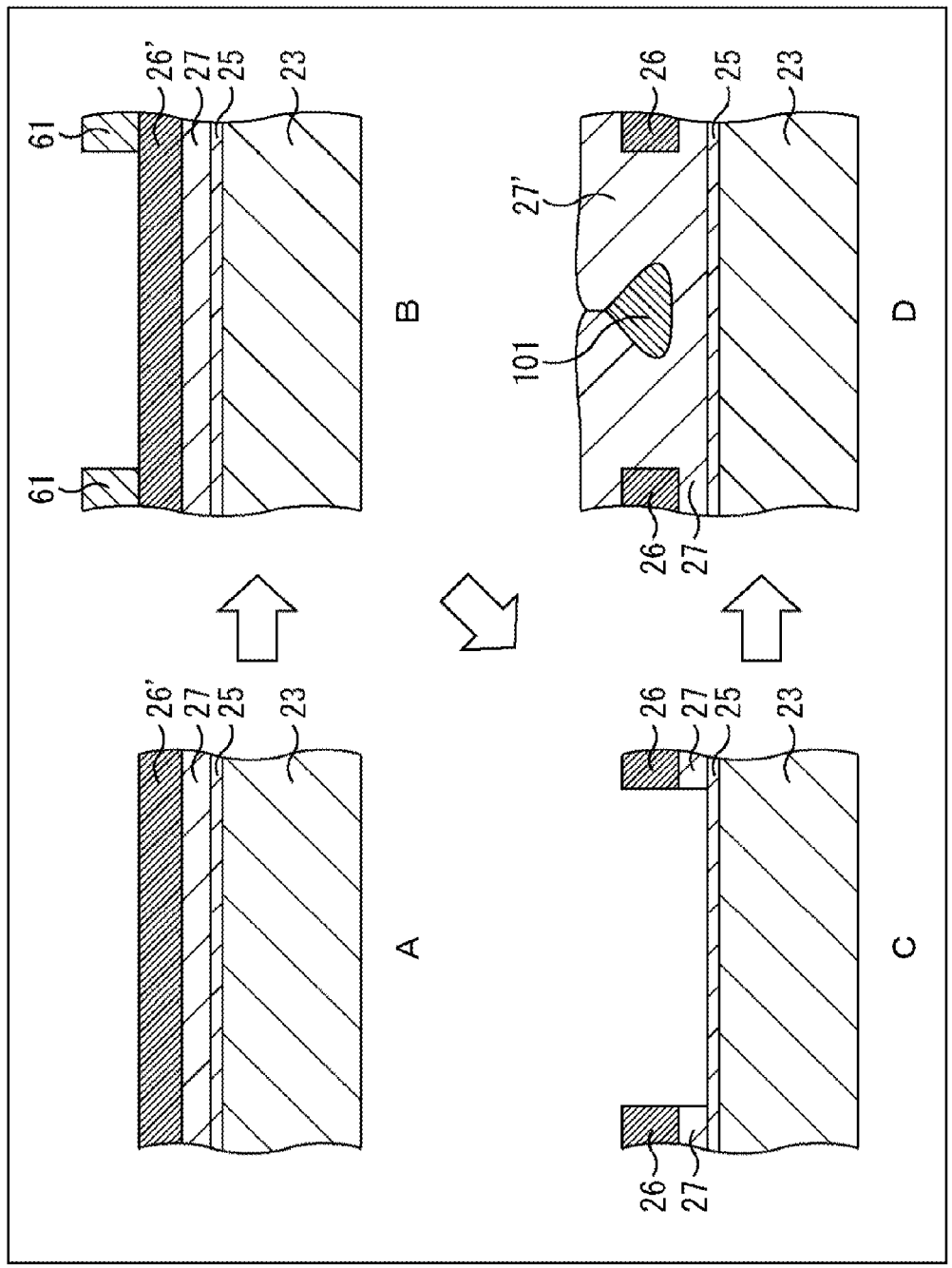
FIG. 22 is a diagram showing the step of forming a pixel.

Here, referring to FIGS. 21 and 22, a description will be given on a flow of forming a pixel of the solid-state imaging apparatus of the structure as shown FIG. 18. FIG. 21 is a flowchart describing a pixel forming process, and FIG. 22 is a cross-sectional view showing a step of forming a pixel.

It should be noted that also in the following, a description will be given on a process after the planarization film 27 is formed over the protection film 25.

Firstly, in step S31, a light-shielding film material is deposited. Specifically, as shown in FIG. 22A, over the planarization film 27, the light-shielding film material 26' using W and the like is deposited, for example. It should be noted that in FIG. 22, an illustration of the photodiodes 24 is omitted.

In step S32, a resist pattern is formed. Specifically, as shown in FIG. 22B, over the light-shielding film material 26', the photoresist pattern 61 for forming the light-shielding film 26.

In step S33, the photoresist pattern 61 is transferred by etching the light-shielding film material 26' formed as an underlying layer thereof, so that a dry etching process is performed. Therefore, as shown in FIG. 22C, the light-shielding film 26 is formed.

In step S34, while a gap is formed in a portion corresponding to the isolation structure 101, the planarization film 27 is stacked. Therefore, as shown in FIG. 22D, the isolation structure 101 which is vacuum-formed (air-formed) is formed in the planarization film 27.

Then, in step S35, over the planarization film 27, the color filer layer 28 is formed.

Further, in step S36, over the first organic material layer 29 formed over the planarization film 27, the microlenses 30 and 30A are formed.

According to the above described processes, the phase difference detection pixels is formed so that a favorable isolation property can be obtained due to the difference between the refractive index of the isolation structure 101 and the refractive index of the material surrounding thereof. Therefore, sensitivity of the phase difference detection pixels can be significantly improved and even when the pixel size reduces, the accuracy of the AF can be prevented from being decreased.

<Other Structure Example>

In the above described embodiments, the phase difference detection pixels have no color filer layer formed. However, the phase difference detection pixels may have the color filer layer formed. The phase difference detection pixels in the above described embodiments have a structure for significantly improving the sensitivity, but depending on an object, a saturated signal amount of the pixels may be exceeded, resulting in decreasing the sensitivity.

Figure 23:
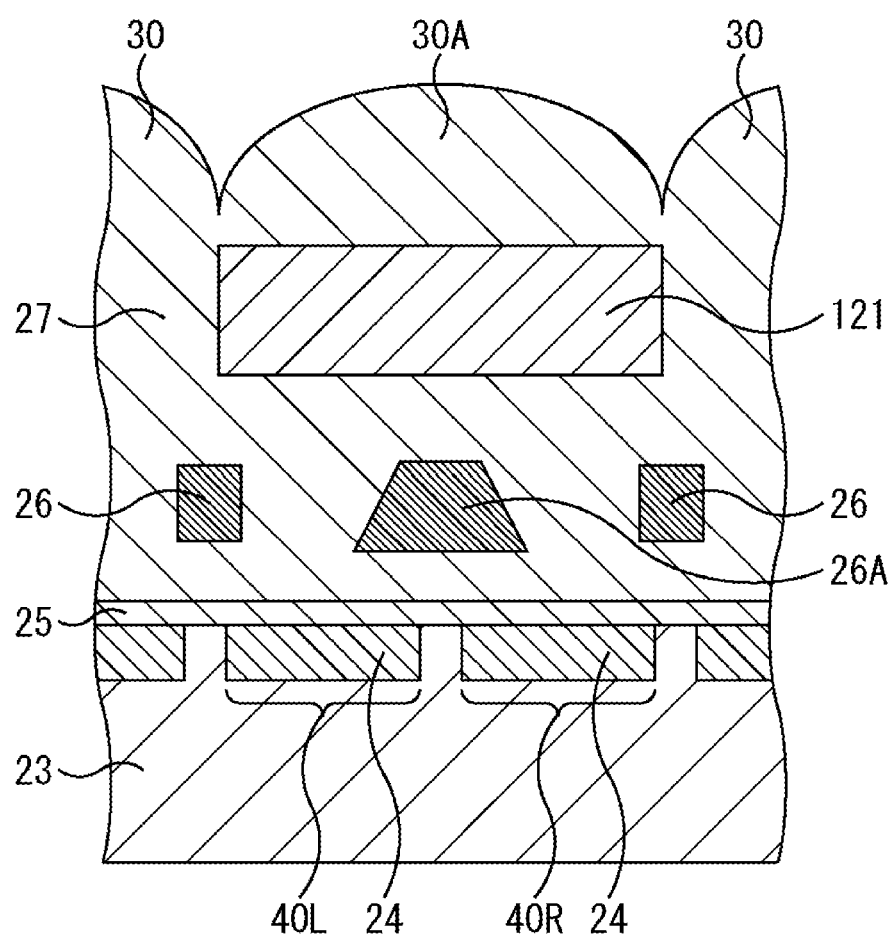
FIG. 23 is a cross-sectional view showing still another structure example of the phase difference detection pixels.

Accordingly, as shown in FIG. 23, an optical filter 121 may be provided in a lower layer of the microlens 30A of the phase difference detection pixels 40L and 40R. The optical filter 121 penetrates only light having a predetermined property (for example, light within the range of a specific wavelength) of incident light.

Therefore, an appropriate signal amount is obtained in accordance with brightness and color of the incident light, and a decrease in sensitivity can be prevented.

Figure 24:
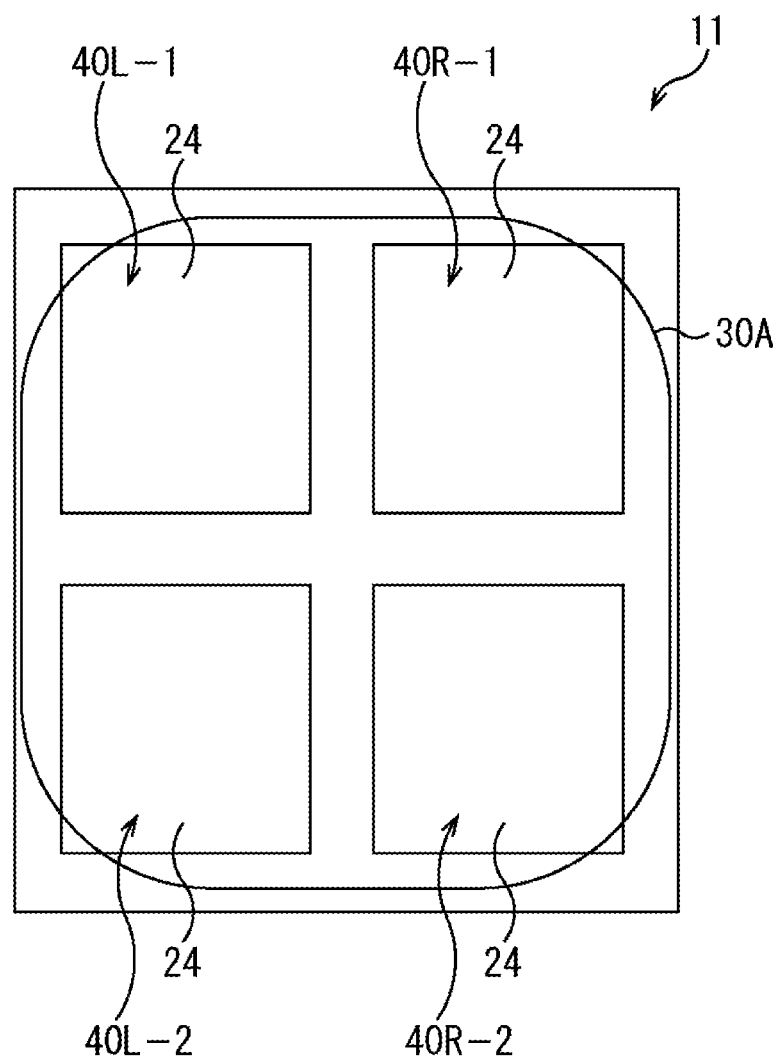
FIG. 24 is a plan view showing another configuration example of the microlens.

Moreover, in the foregoing description, the present technology is applied to the phase difference detection pixels for separate the incident light into the light entering from the left side of the pupil surface and the light entering from the right side of the pupil surface. However, as shown in FIG. 24, the present technology may be applied to phase difference detection pixels 40L-1, 40R-1, 40L-2, and 40R-2 for separate the incident light into light entering from the upper left side of the pupil surface, light entering from the upper right side of the pupil surface, light entering from the lower left side of the pupil surface, and light entering from the lower right side of the pupil surface. In this case, one microlens 30A is formed corresponding to four phase difference detection pixels 40L-1, 40R-1, 40L-2, and 40R-2 arranged in a matrix form.

Further, in the foregoing description, the isolation structure is formed of W, or a transparent dielectric, or is vacuum-formed (air-formed), but may be formed of a material such as Al and Ag with a high refractive index or a material such as Cu generally used for a semiconductor process. Moreover, the isolation structure may be formed using both a metal and a dielectric. In this case, the isolation structure is formed by coating a thin metal film over the dielectric.

It should be noted that these structures can also be applied to the phase difference detection pixels according to the above described other embodiments.

The present technology is not limitedly applicable to the solid-state imaging apparatus and is applicable to general electronic apparatuses having a solid-state imaging apparatus, including an imaging apparatus such as a digital still camera and a video camera and a mobile terminal apparatus having an imaging function such as a mobile phone.

<Application to Electronic Apparatus>

Figure 25:
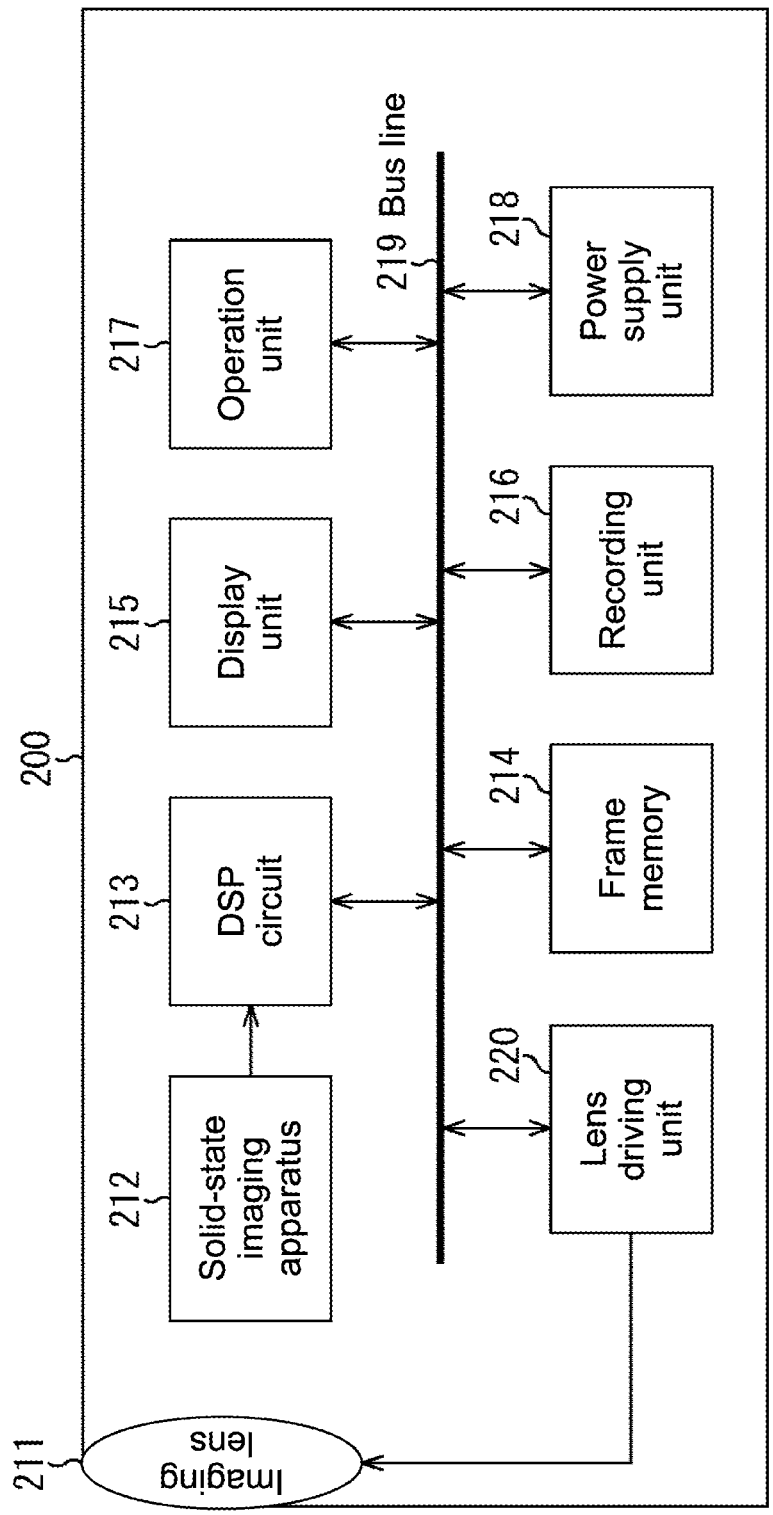
FIG. 25 is a block diagram showing a configuration example of an electronic apparatus to which an embodiment of the present technology is applied.

FIG. 25 is a block diagram showing a configuration example of an imaging apparatus as an example of an electronic apparatus to which an embodiment of the present technology is applied.

As shown in FIG. 25, an imaging apparatus 200 includes an optical system having an imaging lens 211, a solid-state imaging apparatus 212, a Digital Signal Processor (DSP) circuit 213 that is a camera signal processing unit, a frame memory 214, a display unit 215, a recording unit 216, an operation unit 217, a power supply unit 218, and the like. The DSP circuit 213, the frame memory 214, the display unit 215, the recording unit 216, the operation unit 217 and the power supply unit 218 are connected to each other in a communicable manner through a bus line 219.

The imaging lens 211 imports incident light from an object and forms an image on an imaging surface of the solid-state imaging apparatus 212. The solid-state imaging apparatus 212 converts the light amount of the incident light image-formed on the imaging surface by the imaging lens 211 into an electric signal in the unit of pixels, and outputs the result as a pixel signal. As the imaging apparatus 212, the solid-state imaging apparatus according to embodiments of the present technology having phase difference detection pixels may be used.

The display unit 215 is constituted of a panel display apparatus such as a liquid crystal display apparatus or an organic Electro Luminescence (EL) display apparatus, and displays a moving image or a still image that is captured by the solid-state imaging apparatus 212. The recording apparatus 216 records the moving image or the still image captured by the solid-state imaging apparatus 212 on a recording medium such as a memory card, a magnetic tape or a Digital Versatile Disk (DVD).

The operation unit 217 gives operation commands with respect to various functions of the imaging apparatus 200 under the operation of a user. The power supply unit 218 appropriately supplies a variety of power that is operation power of the DSP circuit 213, the frame memory 214, the display unit 215, the recording unit 216 and the operation unit 217, to these supply targets.

The imaging apparatus 200 further includes a lens driving unit 220 that drives the imaging lens 211 in its optical axis direction. The lens driving unit 220 configures a focus mechanism that performs focus adjustment, together with the imaging lens 211. Further, the imaging apparatus 200 performs various controls such as a control of the focus mechanism or a control of the respective components described above, by a system controller (not shown).

With respect to the control of the focus mechanism, on the basis of the phase difference detection signal output from the phase difference detection pixels according to embodiments of the present technology, for example, in the DSP circuit 213, an arithmetic process of calculating the shift direction and shift amount of a focus is performed. With such an arithmetic process, the system controller (not shown) performs a focus control for focusing by moving the imaging lens 201 through the lens driving unit 220 in the optical axis direction.

It should be noted that the embodiments of the present technology are not limited to the above described embodiments but may have various modifications without departing from the scope of the present technology.

Embodiments of the present technology may be configured as follows:

(1) A solid-state imaging apparatus, including: a plurality of phase difference detection pixels configured adjacent to one another; and an isolation structure arranged so as to isolate light entering each of light-receiving units of the plurality of phase difference detection pixels, in which the isolation structure is formed so as to have a inclined side wall surface whose cross section is tapered.

(2) The solid-state imaging apparatus according to Item (1), further including a microlens formed corresponding to the plurality of phase difference detection pixels.

(3) The solid-state imaging apparatus according to Item (2), in which a difference between a refractive index of the isolation structure and a refractive index of a surrounding material of the isolation structure is at least 0.2.

(4) The solid-state imaging apparatus according to Item (3), in which the refractive index of the isolation structure is about one.

(5) The solid-state imaging apparatus according to Item (2), in which the microlens is formed so as to have a lens power higher than other microlenses formed corresponding to imaging pixels arranged in a pixel region, together with the plurality of phase difference detection pixels.

(6) The solid-state imaging apparatus according to Item (2), in which the isolation structure is formed so that the inclination of the side wall surface is adjusted in accordance with an isolation property of the plurality of phase difference detection pixels.

(7) The solid-state imaging apparatus according to Item (2), in which the isolation structure is formed so that a width of an upper surface is adjusted in accordance with an isolation property of the plurality of phase difference detection pixels.

(8) The solid-state imaging apparatus according to any one of Items (2) to (7), in which a trench is formed between each of the light-receiving units of the plurality of phase difference detection pixels.

(9) The solid-state imaging apparatus according to any one of Items (2) to (8), in which the isolation structure has an antireflection film formed on an upper surface thereof.

(10) The solid-state imaging apparatus according to any one of Items (2) to (9), in which the plurality of phase difference detection pixels have an optical filter formed in a lower layer of the microlens.

(11) The solid-state imaging apparatus according to any one of Items (2) to (10), in which the microlens is formed corresponding to two adjacent phase difference detection pixels.

(12) The solid-state imaging apparatus according to any one of Items (2) to (10), in which the microlens is formed corresponding to four phase difference detection pixels arranged in a matrix form.

(13) A method of manufacturing a solid-state imaging apparatus, including: a plurality of phase difference detection pixels configured adjacent to one another; and an isolation structure arranged so as to isolate light entering each of light-receiving units of the plurality of phase difference detection pixels, the method including forming the isolation structure so as to have a inclined side wall surface whose cross section is tapered.

(14) An electronic apparatus, including a solid-state imaging apparatus having: a plurality of phase difference detection pixels configured adjacent to one another; and an isolation structure arranged so as to isolate light entering each of light-receiving units of the plurality of phase difference detection pixels, in which the isolation structure is formed so as to have a inclined side wall surface whose cross section is tapered.

It should be understood by those skilled in the art that various modifications, combinations, sub-combinations and alterations may occur depending on design requirements and other factors insofar as they are within the scope of the appended claims or the equivalents thereof.

What is claimed is:

1. An imaging apparatus comprising:
   pixels including a first pixel, a second pixel and third pixel arranged horizontally with respect to each other, the first pixel being adjacent the second pixel, the second pixel being adjacent the third pixel, each of the pixels having a light receiving unit;
   a respective lens disposed vertically aligned with and over each of the first, second third pixel;
   in a cross sectional view, a first isolation structure disposed horizontally between the first pixel and the second pixel;
   in the cross sectional view, a second isolation structure disposed horizontally between the second pixel and third pixel;
   in the cross sectional view, a first trench region disposed horizontally between the first pixel and the second pixel;
   in the cross sectional view, a second trench region disposed horizontally between the second pixel and third pixel; and
   in the cross sectional view, a third trench region disposed within the second pixel, wherein, the first isolation structure is disposed vertically aligned with and over the first trench region and the second isolation structure is disposed vertically aligned with and over the second trench region.

2. The imaging apparatus of claim 1, wherein the second pixel is a phase difference detection pixel.

3. The imaging apparatus of claim 2, wherein the phase difference detection pixel includes at least a first photodiode region and a second photodiode region.

4. The imaging apparatus of claim 3, wherein the third trench region is disposed horizontally between the first photodiode region and the second photodiode region.

5. The imaging apparatus according to claim 1, wherein the first pixel, the second pixel and the third pixel are disposed within a same substrate.

6. The imaging apparatus of claim 5, wherein the substrate is an Si substrate.

7. The imaging apparatus of claim 1, wherein each lens is a microlens positioned corresponding to its respective pixel of the first pixel, the second pixel and the third pixel.

8. The imaging apparatus of claim 2, wherein the first and second isolation structures have antireflection films formed on upper surfaces thereof.

9. An electronic apparatus comprising the imaging apparatus of claim 1.

* * * * *